(12) United States Patent
Kim et al.

(10) Patent No.: US 10,757,808 B2
(45) Date of Patent: Aug. 25, 2020

(54) DISPLAY DEVICE AND METHOD OF FABRICATING THE SAME

(71) Applicant: SAMSUNG DISPLAY CO., LTD., Yongin-si, Gyeonggi-Do (KR)

(72) Inventors: Byoungyong Kim, Seoul (KR); Jeongho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 30 days.

(21) Appl. No.: 16/247,753

(22) Filed: Jan. 15, 2019

(65) Prior Publication Data

US 2019/0223289 A1 Jul. 18, 2019

(30) Foreign Application Priority Data

Jan. 16, 2018 (KR) .................. 10-2018-0005456
Mar. 22, 2018 (KR) .................. 10-2018-0033418

(51) Int. Cl.
*H05K 1/11* (2006.01)
*H01L 27/32* (2006.01)
(Continued)

(52) U.S. Cl.
CPC ....... *H05K 1/118* (2013.01); *G02F 1/133305* (2013.01); *G02F 1/136277* (2013.01); *G02F 1/136286* (2013.01); *G06F 3/0412* (2013.01); *G06F 3/04164* (2019.05); *H01L 27/3276* (2013.01); *H05K 1/189* (2013.01); *H05K 13/0015* (2013.01); *H05K 13/04* (2013.01);
(Continued)

(58) Field of Classification Search
CPC .... H05K 1/118; H05K 1/189; H05K 13/0015; H05K 13/04; G06F 3/04164; G06F 3/0412; G06F 3/0445; G06F 3/0446; G02F 1/133305; G02F 1/136277; G02F 1/136286; H01L 27/3276; H01L 2251/5338

See application file for complete search history.

(56) References Cited

U.S. PATENT DOCUMENTS 3,683,771 A 8/1972 Land
3,746,594 A 7/1973 Bachelder et al.
(Continued)

FOREIGN PATENT DOCUMENTS

KR 10-2016-0051401 5/2016
KR 10-1740006 5/2017

*Primary Examiner* — Peter D McLoone
(74) *Attorney, Agent, or Firm* — F. Chau & Associates, LLC

(57) ABSTRACT

A display device includes: a display panel including a plurality of pixels that display an image, and a pixel pad portion; a first flexible film electrically connected to the display panel, the first flexible film including a first base film, an output pad portion, and an input pad portion, wherein the first base film includes a surface and an opposite surface facing each other, wherein the output pad portion is disposed on the surface of the first base film and is coupled to the pixel pad portion, and wherein the input pad portion is disposed on the surface of the first base film; a circuit substrate electrically connected to the display panel through the input pad portion, the circuit substrate including a first driving pad portion; and a first substrate disposed on the opposite surface and overlapping either the input pad portion or the output pad portion.

20 Claims, 23 Drawing Sheets

(51) Int. Cl.
*G02F 1/1333* (2006.01)
*G02F 1/1362* (2006.01)
*H05K 13/04* (2006.01)
*H05K 1/18* (2006.01)
*G06F 3/041* (2006.01)
*H05K 13/00* (2006.01)
*G06F 3/044* (2006.01)

(52) U.S. Cl.
CPC .......... *G06F 3/0445* (2019.05); *G06F 3/0446* (2019.05); *H01L 2251/5338* (2013.01)

(56) References Cited

U.S. PATENT DOCUMENTS

| | | | |
|---|---|---|---|
| 3,780,213 A | 12/1973 | Harna | |
| 8,305,541 B2* | 11/2012 | Hwang | G02F 1/13452 349/150 |
| 8,786,814 B2* | 7/2014 | Kim | G02F 1/13452 349/150 |
| 2010/0214519 A1* | 8/2010 | Hwang | G02F 1/13452 349/150 |
| 2012/0293399 A1* | 11/2012 | Haskin | G02F 1/134309 345/88 |
| 2013/0077005 A1* | 3/2013 | Kim | G02F 1/13452 349/40 |
| 2014/0111407 A1* | 4/2014 | Kwon | G09G 3/006 345/82 |
| 2016/0118451 A1* | 4/2016 | Youn | H01L 27/3262 257/40 |

* cited by examiner

FIG. 2A
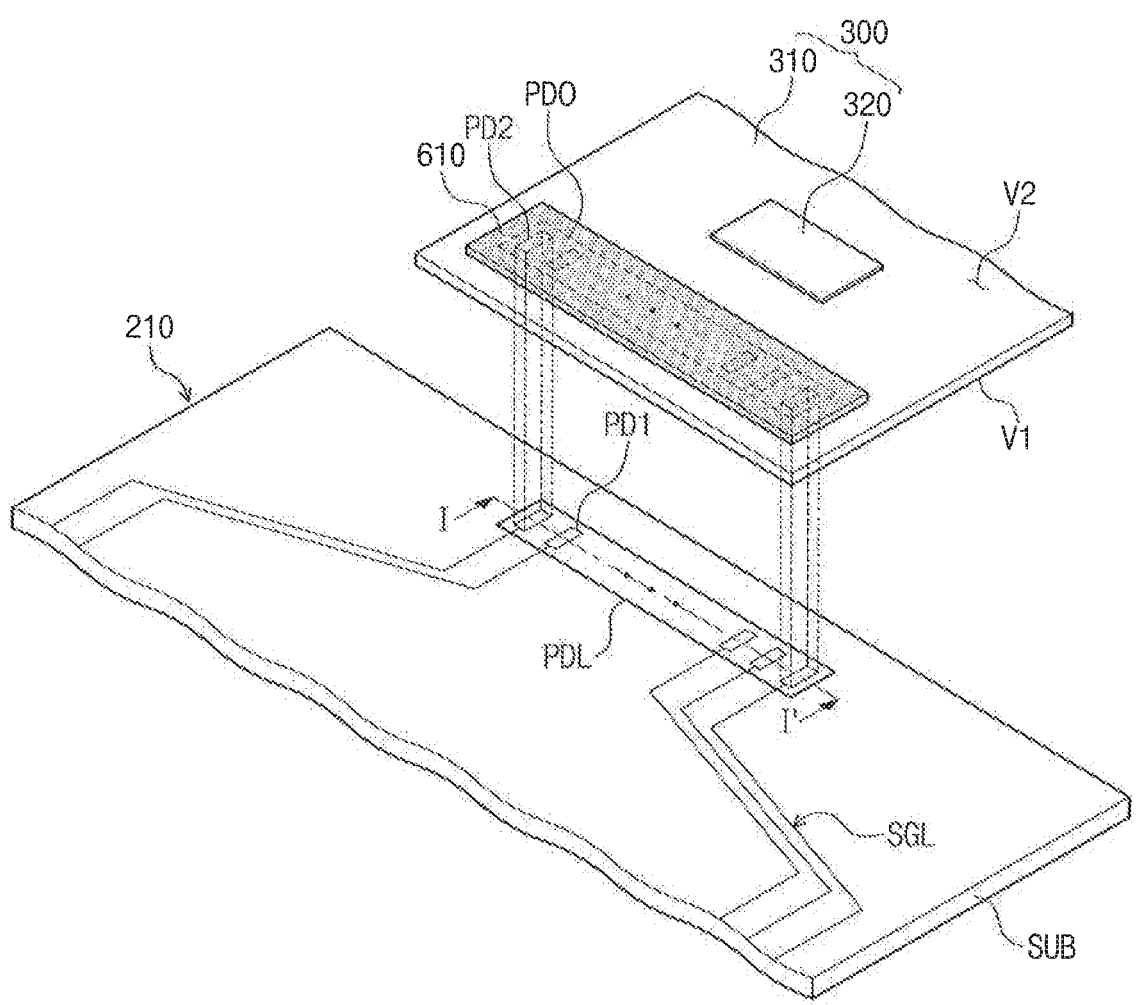
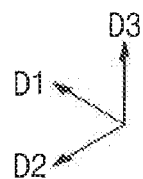

FIG. 3A
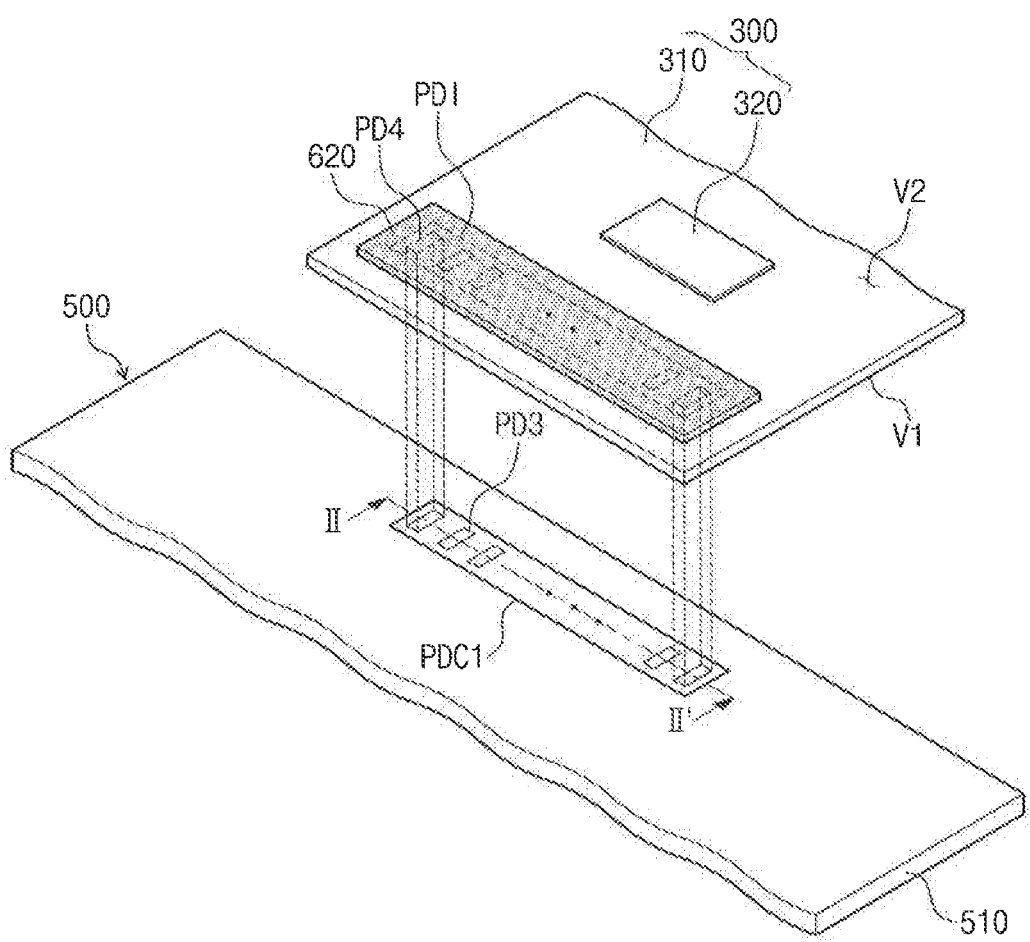
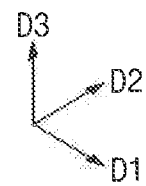

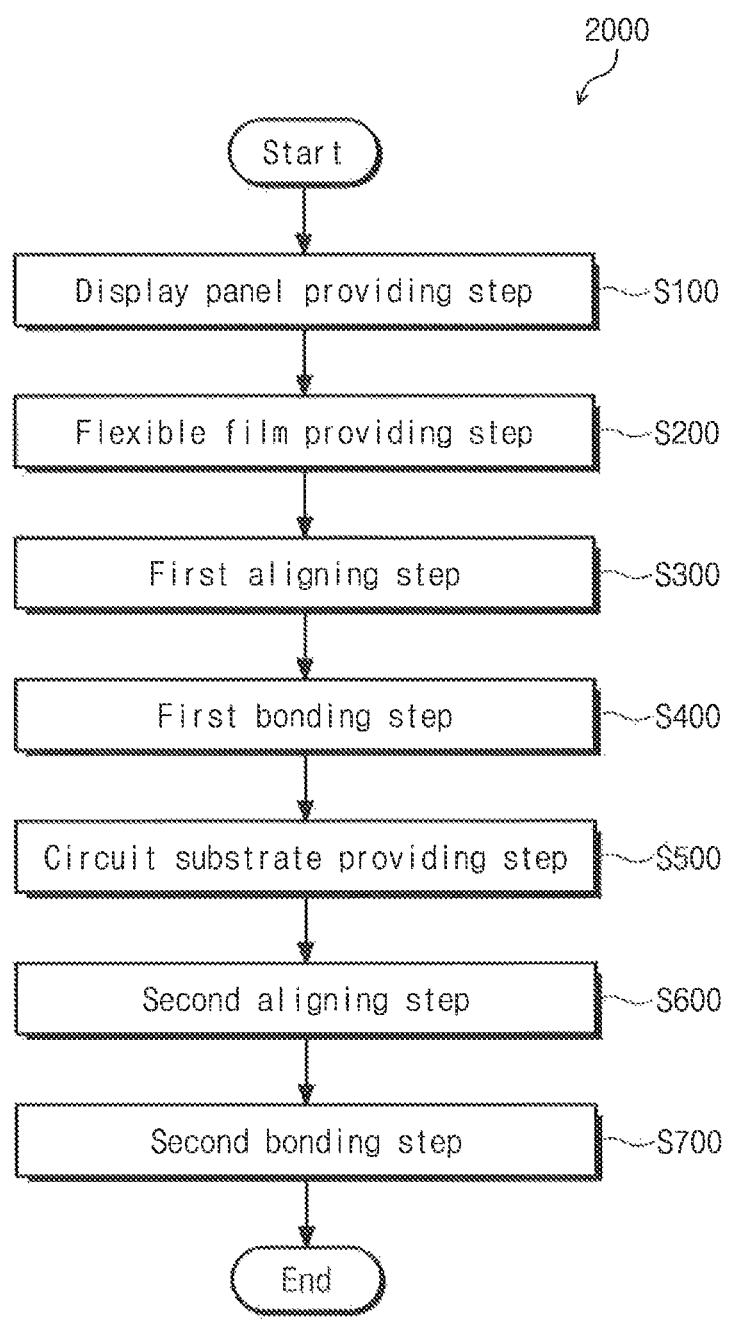

FIG. 7B
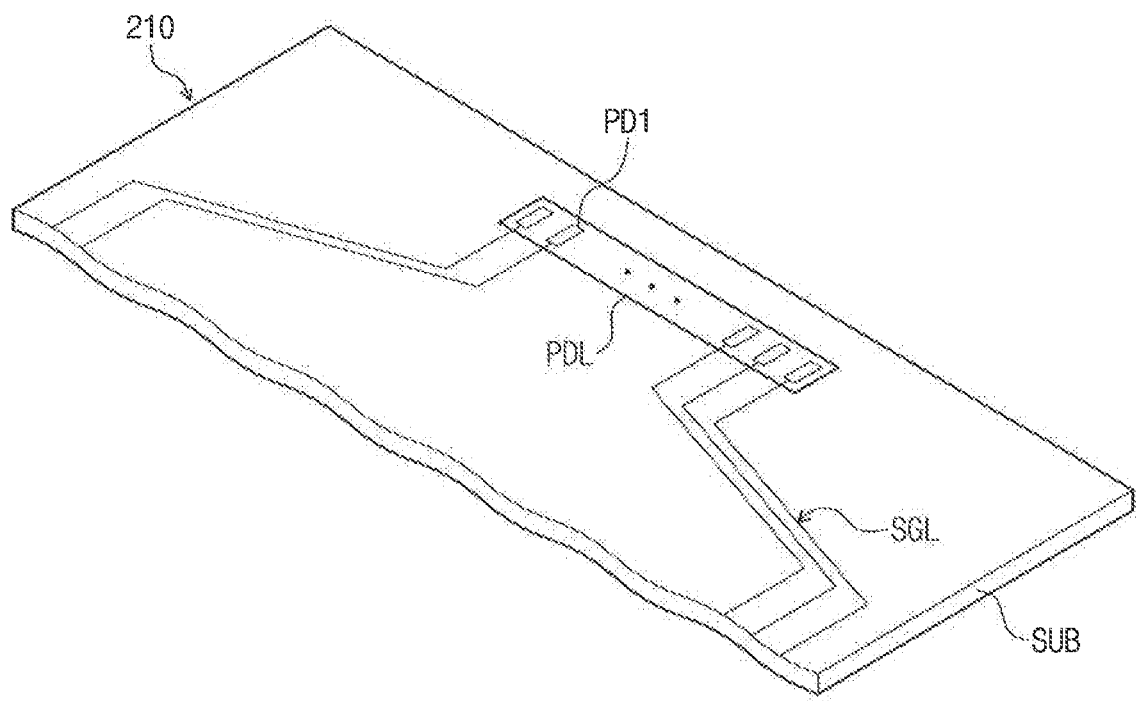
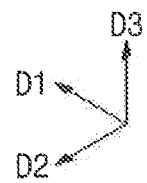

FIG. 7F
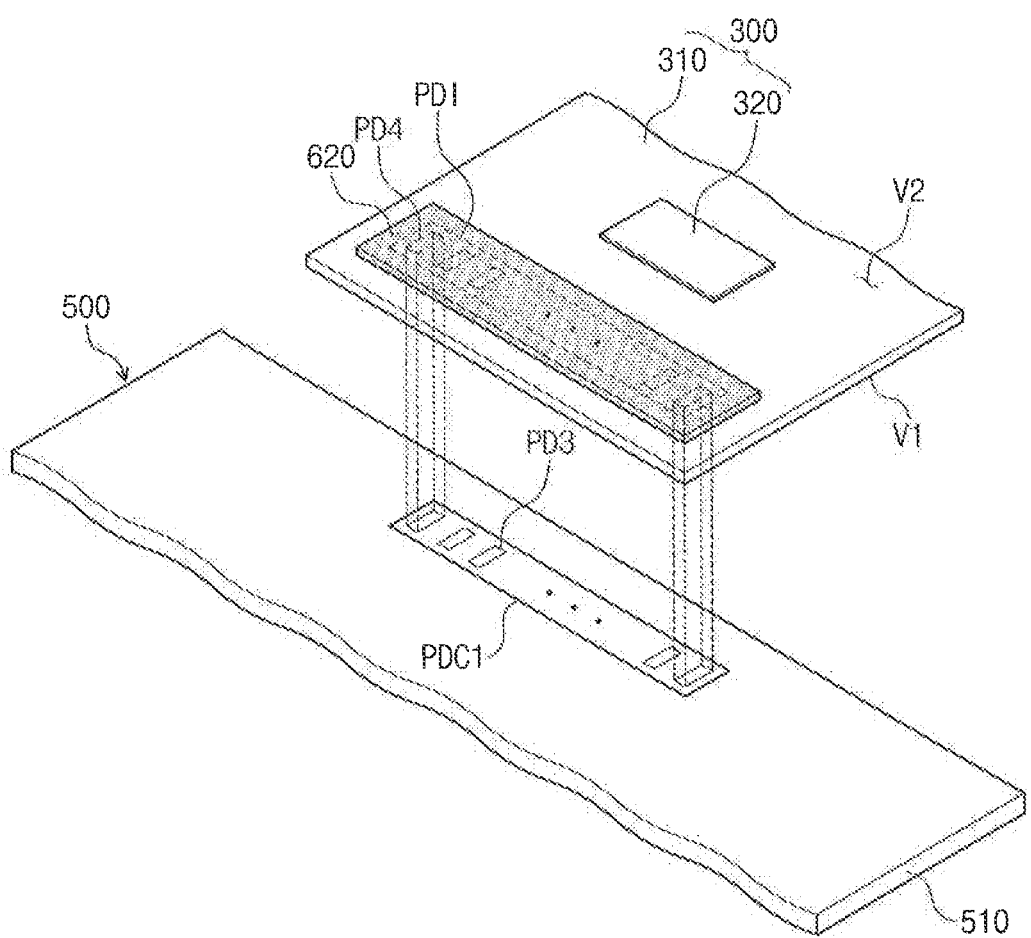
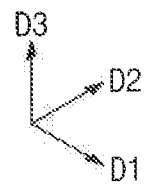

DISPLAY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application Nos. 10-2018-0005456 and 10-2018-0033418 filed on Jan. 16, 2018 and Mar. 22, 2018, respectively, the disclosures of which are incorporated by reference herein in their entireties.

TECHNICAL FIELD

The present disclosure relates to a display device and a method of fabricating the display device, and more particularly, to a display device with improved processing reliability and a method of fabricating the display device.

DISCUSSION OF THE RELATED ART

Various display devices are currently being developed for use in multimedia devices such as televisions, mobile phones, tablet computers, navigation systems, gaming machines, and the like.

Generally, a display device includes a display panel configured to display an image. The display panel includes a plurality of gate lines, a plurality of data lines, and a plurality of pixels connected to the gate lines and data lines.

The display panel is electrically connected to a driving circuit board configured to output driving signals to the display panel through a circuit board connected to the display panel and the driving circuit board. The circuit board may be a flexible circuit board, and the circuit board and the driving circuit board are connected to each other using an anisotropic conductive film or by an ultrasonic wave method.

SUMMARY

According to an exemplary embodiment of the present inventive concept, a display device includes: a display panel including a plurality of pixels that display an image, and a pixel pad portion connected to the pixels; a first flexible film electrically connected to the display panel, the first flexible film including a first base film, an output pad portion, and an input pad portion, wherein the first base film includes a surface and an opposite surface facing each other, wherein the output pad portion is disposed on the surface of the first base film and is coupled to the pixel pad portion, and wherein the input pad portion is disposed on the surface of the first base film and is spaced apart from the output pad portion; a circuit substrate electrically connected to the display panel through the input pad portion, the circuit substrate including a first driving pad portion; and a first substrate disposed on the opposite surface and overlapping either the input pad portion or the output pad portion.

In an exemplary embodiment of the present inventive concept, each of the input and output pad portions includes a plurality of pads arranged in a first direction. The first substrate includes a plurality of first patterns arranged in the first direction, and a plurality of second patterns alternately arranged with the first patterns in the first direction. Each first pattern has a first width in a second direction crossing the first direction, and each second pattern has a second width smaller than the first width in the second direction. The first patterns overlap the pads of the pad portion overlapped by the first substrate, and the second patterns are disposed between the pads of the pad portion overlapped by the first substrate.

In an exemplary embodiment of the present inventive concept, the first substrate includes at least one of plastic or metallic materials.

In an exemplary embodiment of the present inventive concept, the first substrate is electrically disconnected from the input and output pad portions by the first base film.

In an exemplary embodiment of the present inventive concept, the display device further includes an input sensing unit including a plurality of sensors disposed on the pixels, and a touch pad portion electrically connected to the sensors.

In an exemplary embodiment of the present inventive concept, the display device further includes a second flexible film electrically connected to the touch pad portion. The second flexible film includes a rear surface and a top surface facing each other, a touch output pad portion, and a touch input pad portion. The touch output pad portion is disposed on the rear surface of the second flexible film and is coupled to the touch pad portion of the input sensing unit. The touch input pad portion is disposed on the rear surface of the second flexible film and is spaced apart from the touch output pad portion, and the circuit substrate further includes a second driving pad portion spaced apart from the first driving pad portion and electrically connected to the touch input pad portion.

In an exemplary embodiment of the present inventive concept, the display device further includes a second substrate disposed on the top surface of the second flexible film. The second substrate overlaps the touch input pad portion and is electrically disconnected from the second driving pad portion by the second flexible film.

In an exemplary embodiment of the present inventive concept, the display device further includes a third substrate, which is disposed to face the first driving pad portion, and overlapping the first driving pad portion and electrically disconnected from the first driving pad portion by the first base film.

In an exemplary embodiment of the present inventive concept, the circuit substrate is flexible.

According to an exemplary embodiment of the present inventive concept, a display device includes: a display substrate including a plurality of pixels that display an image, and a plurality of pixel pads connected to the pixels; a flexible film including a base film including a surface facing the pixel pads and an opposite surface facing the surface, and a plurality of output pads disposed on the surface of the base film and coupled to the pixel pads, respectively; and a rigid substrate disposed on the opposite surface of the base film and overlapping the output pads.

In an exemplary embodiment of the present inventive concept, the rigid substrate includes a plurality of first patterns respectively overlapping the output pads and arranged in an arrangement direction of the output pads, and a plurality of second patterns alternately arranged with and connected to the first patterns and disposed between the output pads, and a width of each of the second patterns is smaller than a width of each of the first patterns, in a direction crossing the arrangement direction of the output pads.

In an exemplary embodiment of the present inventive concept, the rigid substrate includes at least one of plastic or metallic materials.

In an exemplary embodiment of the present inventive concept, at least a portion where the pixel pads and the output pads are in direct contact with each other is formed of a material different from that of the pixel pads and the output pads.

According to an exemplary embodiment of the present inventive concept, a method of fabricating a display device includes: providing a display panel including a plurality of pixels that displays an image, and a pixel pad portion connected to the pixels; providing a flexible film including a base film, an output pad portion, and a first substrate, wherein the base film includes a surface and an opposite surface facing each other, wherein the output pad portion is disposed on the surface of the base film and is coupled to the pixel pad portion of the display panel, and wherein the first substrate is disposed on the opposite surface of the base film and overlaps the output pad portion; performing a first aligning step including aligning an ultrasonic wave device to the first substrate; performing a first bonding step including bonding the pixel pad portion of the display panel to the output pad portion of the flexible film using the ultrasonic wave device. The ultrasonic wave device is placed to be in contact with the first substrate.

In an exemplary embodiment of the present inventive concept, the first substrate includes at least one of plastic or metallic materials.

In an exemplary embodiment of the present inventive concept, the first bonding step further includes melting at least a portion of each of the pixel pad portion and the output pad portion.

In an exemplary embodiment of the present inventive concept, the flexible film includes: an input pad portion disposed on the surface of the base film and spaced apart from the output pad portion; and a second substrate disposed on the opposite surface of the base film and overlapping the input pad portion.

In an exemplary embodiment of the present inventive concept, the display device further includes: providing a circuit board including a driving pad portion overlapping the input pad portion; performing a second aligning step including aligning the ultrasonic wave device to the second substrate; and performing a second bonding step including bonding the driving pad portion to the input pad portion using the ultrasonic wave device. The ultrasonic wave device is placed to be in contact with the second substrate.

In an exemplary embodiment of the present inventive concept, the second bonding step further includes melting at least a portion of each of the driving pad portion and the input pad portion.

In an exemplary embodiment of the present inventive concept, the output pad portion includes a plurality of pads arranged to be spaced apart from each other in a first direction. The ultrasonic wave device includes a generator configured to cause an initial vibrational motion, an amplifier configured to amplify an amplitude of the vibrational motion, a vibrating part configured to transfer a vibration energy from the amplifier to the plurality of pads of the output pad portion and including a protruding portion, and a pressing part configured to exert pressure on the vibrating part. The protruding portion is configured to be in contact with the first substrate and to perform a horizontal motion in a second direction crossing the first direction.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein:

FIG. 2A is a perspective view illustrating a portion of a display device according to an exemplary embodiment of the present inventive concept;

FIG. 3A is a perspective view illustrating a portion of a display device according to an exemplary embodiment of the present inventive concept;

FIG. 6 is a block diagram illustrating a method of fabricating a display device according to an exemplary embodiment of the present inventive concept;

FIGS. 7B, 7C, 7D, 7E, 7F, 7G, 7H are diagrams illustrating a method of fabricating a display device according to an exemplary embodiment of the present inventive concept.

DETAILED DESCRIPTION OF THE EMBODIMENTS

Figure 1A:
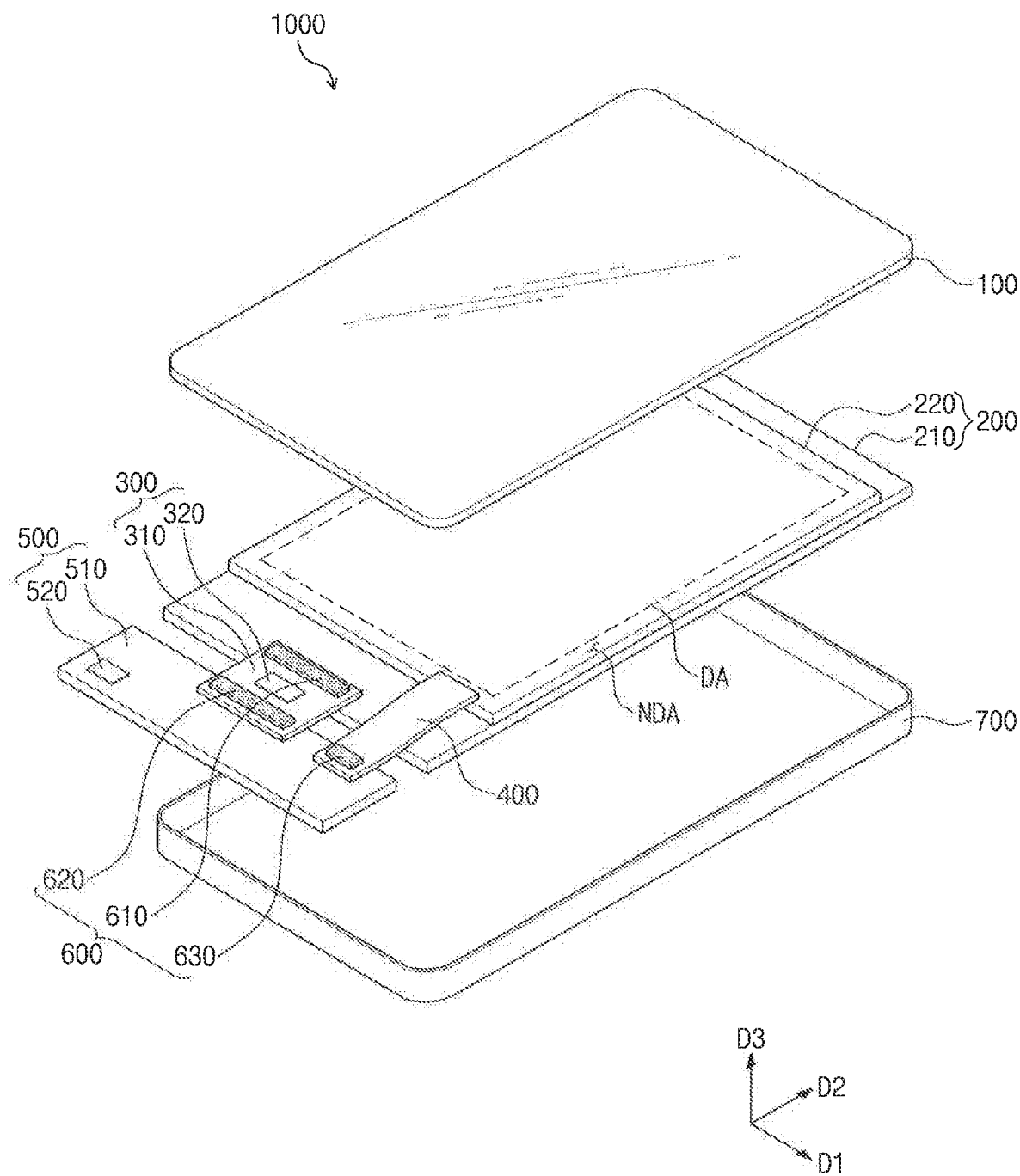
FIG. 1A is an exploded perspective view illustrating a display device according to an exemplary embodiment of the present inventive concept.

Exemplary embodiments of the present inventive concept will now be described more fully hereinafter with reference to the accompanying drawings. Exemplary embodiments of the present inventive concept may, however, be embodied in many different forms and should not be construed as being limited to the exemplary embodiments set forth herein. It will be understood that like reference numerals in the drawings may denote like elements, and thus repetitive descriptions may be omitted.

It will be understood that the drawings are not to scale and may not precisely reflect the precise structural or performance characteristics of any given exemplary embodiment, and should not be interpreted as defining or limiting the range of values or properties encompassed by exemplary embodiments of the present inventive concept. For example, the relative thicknesses and positioning of molecules, layers, regions and/or structural elements may be exaggerated for clarity.

It will be understood that, in the drawings, like reference numerals may refer to like elements, and thus repetitive descriptions may be omitted.

It will be understood that when an element is referred to as being "connected" or "coupled" to another element, the element can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present inventive concept.

Spatially relative terms, such as "beneath," "below," "lower," "above," "upper" and the like, may be used herein for ease of description to describe the relations between one element or feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, the term "below" can encompass both an orientation of above and below. The device may also be oriented in another direction (e.g., rotated 90 degrees or at other orientations), and thus, the spatially relative terms used herein may be interpreted accordingly.

In the present specification, first to third directions DR1, DR2, and DR3 will be used to describe three different directions. For example, the third direction DR3 may be used to differentiate a front or top surface from a back or bottom surface of each element. In addition, the first and second directions DR1 and D2 may cross each other and the third direction DR3, and the first and second direction DR1 and DR2 may form a plane parallel to a surface of an element. However, directions indicated by the first to third directions DR1, DR2, and DR3 are relative concepts and are not limited to the specific directions.

Figure 1B:
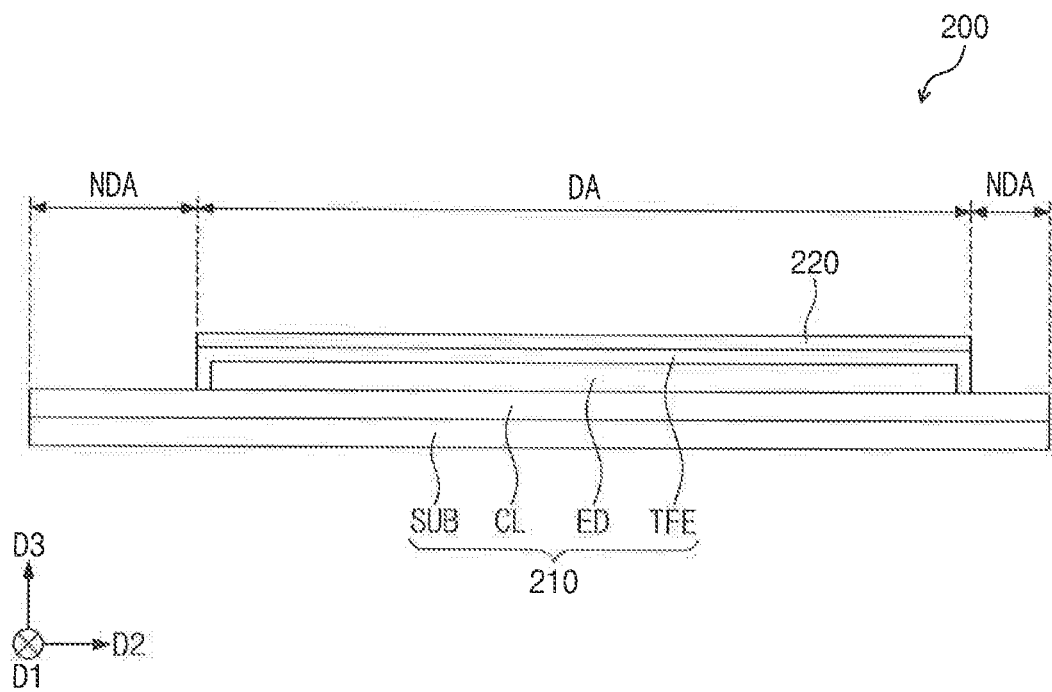
FIG. 1B is a sectional view illustrating a display module according to an exemplary embodiment of the present inventive concept.
Figure 1C:
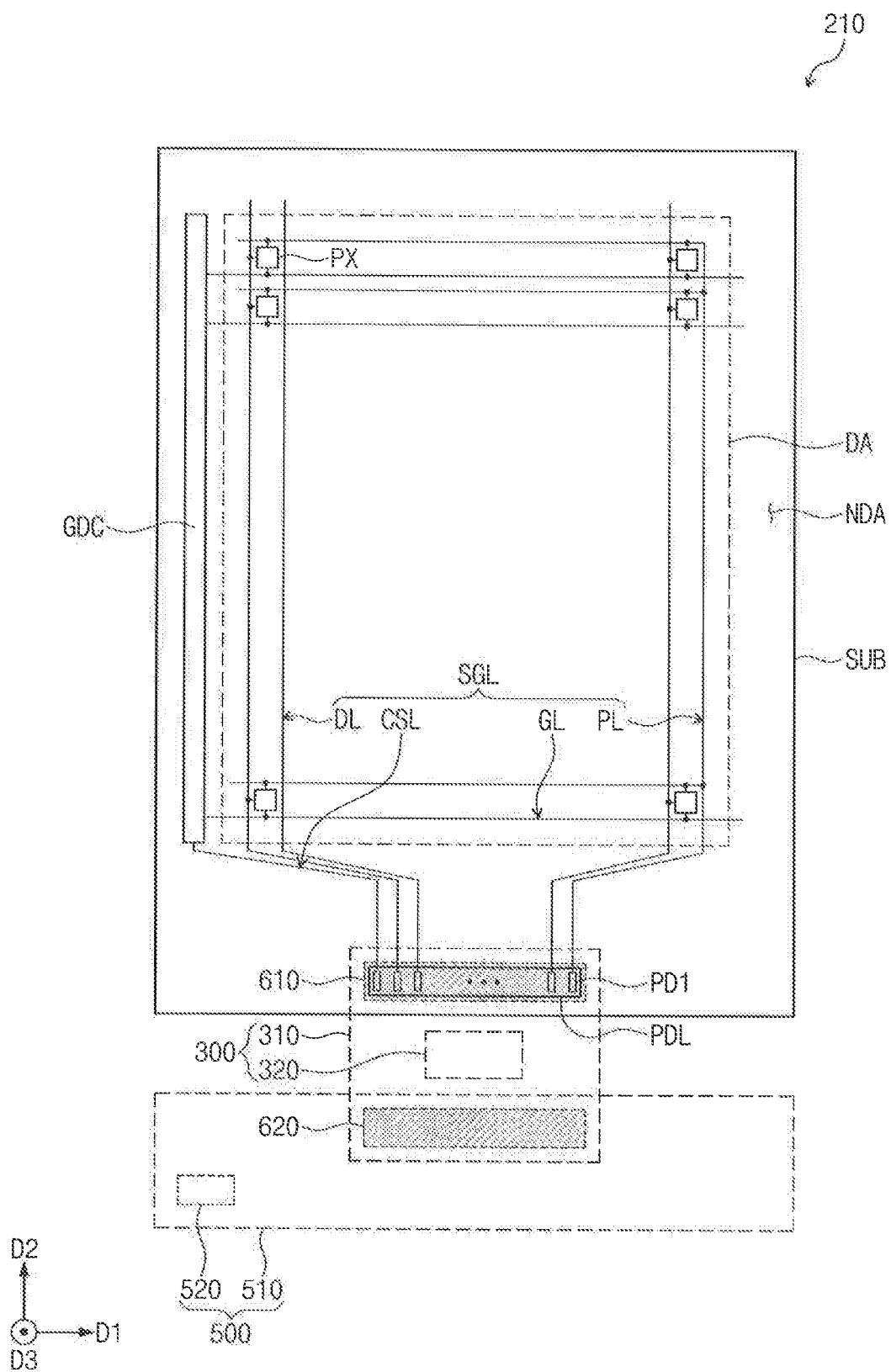
FIG. 1C is a plan view illustrating a display panel according to an exemplary embodiment of the present inventive concept.
Figure 1D:
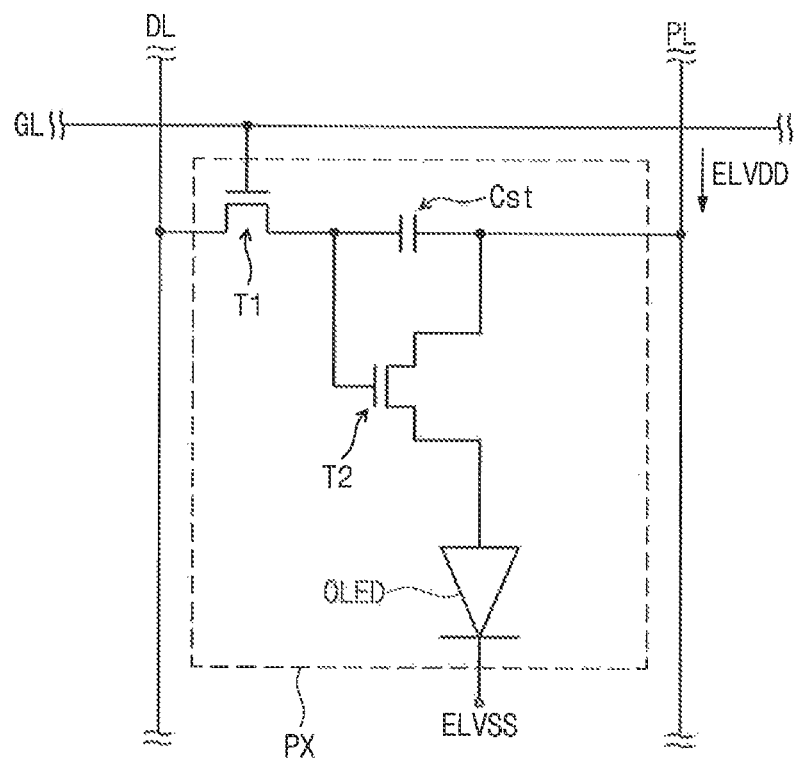
FIG. 1D is a circuit diagram of a pixel shown in FIG. 1C.

FIG. 1A is an exploded perspective view illustrating a display device according to an exemplary embodiment of the present inventive concept. FIG. 1B is a sectional view illustrating a display module according to an exemplary embodiment of present the inventive concept. FIG. 1C is a plan view illustrating a display panel according to an exemplary embodiment of the present inventive concept. FIG. 1D is a circuit diagram of a pixel shown in FIG. 1C. A display device according to an exemplary embodiment of the present inventive concept will be described in more detail with reference to FIGS. 1A to 1D.

As shown in FIG. 1A, a display device 1000 may include a window member 100, a display module 200, a first flexible film 300, a second flexible film 400, a circuit substrate 500, substrates 600, and a container member 700.

The window member 100 may be disposed on the display module 200. The window member 100 may be configured to protect the display module 200 from an external impact, a contamination material or the like. The window member 100 may be formed of a transparent material, allowing an image to be emitted from the display module 200 to the outside. For example, the window member 100 may be formed of glass, sapphire, plastic, or the like. The window member 100 may have a single-layered structure, as shown in FIG. 1A, but the present inventive concept is not limited thereto. For example, the window member 100 may include a plurality of layers. Although not shown, the window member 100 may further include a bezel region corresponding to a non-display region NDA to be described below, but the present inventive concept is not limited thereto.

The display module 200 may be configured to display an image in response to electrical signals applied thereto. The display module 200 may include a display region DA and a non-display region NDA. The display region DA may be a region of the display module 200, which is used to display an image, and the non-display region NDA may at least partially surround the display region DA. For example, the non-display region NDA may enclose the display region DA. For example, in FIG. 1, the non-display region NDA has a rectangular shape; however, the shape of the non-display region NDA is not limited thereto and may be variously changed.

The display module 200 may include a display panel 210 and an input sensing unit 220. The display panel 210 may be disposed below the window member 100. The display panel 210 may be configured to generate an image and to provide the image to the window member 100.

In an exemplary embodiment of the present inventive concept, the display panel 210 may be an organic light emitting display panel, a liquid crystal display panel, a plasma display panel, an electrophoresis display panel, a microelectromechanical system (MEMS) display panel, or an electrowetting display panel. The description that follows will refer to an example in which the display panel 210 is an organic light emitting display panel. However, the present inventive concept is not limited to this example, and the present inventive concept may be applied to various display panels.

Referring to FIG. 1B, the display panel 210 may include a base substrate SUB, a circuit layer CL, a display device layer ED, and an encapsulation layer TFE.

The base substrate SUB may be a flexible substrate, such as a plastic substrate, a glass substrate, a metal substrate, and/or a substrate made of an organic/inorganic composite material. In an exemplary embodiment of the present inventive concept, the base substrate SUB may include at least one plastic film.

The circuit layer CL may be disposed on the base substrate SUB. The circuit layer CL may include signal lines, a control circuit, and a semiconductor layer.

The display device layer ED may include an organic light emitting device OLED (e.g., see FIG. 1D) and a pixel definition layer. The encapsulation layer TFE may be disposed to hermetically seal the display device layer ED. In an exemplary embodiment of the present inventive concept, the encapsulation layer TFE may include at least one organic layer and at least one inorganic layer. The inorganic layer may protect the display device layer ED from moisture, oxygen or the like. The inorganic layer may include, for example, a silicon nitride layer, a silicon oxynitride layer, a silicon oxide layer, a titanium oxide layer, and/or an aluminum oxide layer, but the present inventive concept is not limited thereto.

In the encapsulation layer TFE, the organic layer may be used to protect the display device layer ED from a contamination material (e.g., particles) and may be disposed to have a flat top surface. The organic layer may be formed of or include an acrylic organic layer, but the present inventive concept is not limited thereto.

In an exemplary embodiment of the present inventive concept, the encapsulation layer TFE may be disposed in the form of a substrate including at least one of glass, sapphire, or plastic materials. Although not shown, a seal member may be further disposed to couple the encapsulation layer TFE to the base substrate SUB. For example, the seal member may be disposed between the encapsulation layer TFE and the circuit layer and/or between the encapsulation layer TFE and the display device ED. In the display device according to an exemplary embodiment of the present inventive concept, the encapsulation layer TFE may have various shapes, and the present inventive concept is not limited to the shape illustrated in FIG. 1.

Referring to FIGS. 1C and 1D, the display panel 210 may include a driving circuit GDC, a plurality of signal lines SGL, a pixel pad portion PDL, and a plurality of pixels PX. The pixels PX may be disposed in the display region DA. Each of the pixels PX may include an organic light emitting device and a pixel driving circuit connected thereto. The driving circuit GDC, the signal lines SGL, the pixel pad portion PDL, and the pixel driving circuit may be included in the circuit layer CL shown in FIG. 1B.

The driving circuit GDC may include a gate driving circuit. The gate driving circuit may be configured to generate a plurality of gate signals and to sequentially output the gate signals to a plurality of gate lines GL to be described below. The gate driving circuit may also be configured to output other control signals to the pixel driving circuit.

The gate driving circuit may include a plurality of thin-film transistors, which are formed by the same method (e.g., a low-temperature polycrystalline silicon (LTPS) process or a low-temperature polycrystalline oxide (LTPO) process) as that for the pixel driving circuit.

The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may be used to provide control signals to the gate driving circuit. The signal lines SGL may be disposed on the display region DA and the non-display region NDA.

The pixel pad portion PDL may be connected to corresponding ones of the pixels PX. The pixel pad portion PDL may be coupled to the driving circuit GDC. The pixel pad portion PDL may include a plurality of pixel pads PD1. The driving circuit may be electrically connected to the pixel pads PD1 through the pixel pad portion PDL.

In an exemplary embodiment of the present inventive concept, the pixel pad portion PDL may correspond to an opening, which is formed in an insulating layer to expose the pixel pads PD1. For example, the insulating layer may be disposed to cover portions of the signal lines SGL, which are disposed at a region other than the pixel pad portion PDL, thereby disconnecting the signal lines SGL from the outside. Further, the insulating layer may be disposed to expose a region (e.g., the pixel pad portion PDL), on which the pixel pads PD1 are disposed, thereby allowing the pixel pad portion PDL to be electrically connected to an external device. However, the present inventive concept is not limited thereto, and in an exemplary embodiment present inventive concept, the insulating layer may be disposed to expose not only the pixel pads PD1 but also the portions of the signal lines SGL, which are disposed at the region other than the pixel pad portion PDL. Here, the pixel pad portion PDL may be a region, on which the pixel pads PD1 are disposed, but the present inventive concept is not limited thereto.

The pixel pads PD1 may overlap the non-display region NDA and may be connected to end portions of the signal lines SGL, respectively. The pixel pad portion PDL may be coupled to at least a portion of the first flexible film 300, thereby being electrically connected to the circuit substrate 500.

The pixel PX may receive a gate signal from the gate line GL and may receive a data signal from the data line DL. Furthermore, the pixel PX may receive a first power voltage ELVDD from the power line PL. The pixel PX may include a first thin-film device T1, a second thin-film device T2, a capacitor Cst, and the organic light emitting device OLED.

The first thin-film device T1 may be configured to selectively output the data signal applied to the data line DL, in response to the gate signal applied to the gate line GL. The capacitor Cst may be charged to have a voltage corresponding to the data signal transmitted from the first thin-film device T1.

The second thin-film device T2 may be connected to the organic light emitting device OLED. The second thin-film device TFT2 may be used to control a driving current flowing through the organic light emitting device OLED, depending on an amount of electric charges stored in the capacitor Cst.

The organic light emitting device OLED may include a first electrode, which is connected to the second thin-film device TFT2, a second electrode, which is used to receive a second power voltage ELVSS, and an organic light emitting layer interposed therebetween. The second power voltage ELVSS may have a voltage level lower than that of the first power voltage ELVDD.

The organic light emitting device OLED may be configured to emit light, when the second thin-film device T2 is turned-on. The structure of the pixel PX is not limited to a specific structure and may be variously changed.

In an exemplary embodiment of the present inventive concept, the input sensing unit 220 may be directly disposed on the display panel 210. In the present embodiment, the input sensing unit 220 may be directly disposed on the encapsulation layer TFE.

The input sensing unit 220 may include sensors including input sensing electrodes and signal lines. The input sensing electrodes and the signal lines may each be a single-layered structure or multi-layered structure. In an exemplary embodiment of the present inventive concept, the input sensing unit 220 may be coupled to the encapsulation layer TFE by an adhesive member, which is disposed on the encapsulation layer TFE. The input sensing electrodes and the signal lines may be formed of or include at least one of, for example, indium tin oxide (ITO), indium zinc oxide (IZO), zinc oxide (ZnO), indium tin zinc oxide (ITZO), PEDOT, metal nano wire, and/or graphene. The input sensing electrodes and the signal lines may include a metal layer (e.g., of molybdenum, silver, titanium, copper, aluminum, or alloys thereof). The input sensing electrodes may have a layer structure that is substantially the same as or different from the signal lines.

The input sensing unit 220 may be configured to obtain information on coordinates of an external input. The input sensing unit 220 may be disposed on the display panel 210. For example, the input sensing unit 220 may be disposed directly on the display panel 210. In an exemplary embodiment of the present inventive concept, the input sensing unit 220 may be directly formed on the display panel 210. However, the present inventive concept is not limited thereto, and for example, the input sensing unit 220 may be disposed in the form of an individual panel and may be coupled to the display panel 210 by an additional adhesive member. The input sensing unit 220 may be configured to sense various inputs, which are disposed from the outside of the display device 1000. For example, the input sensing unit 220 may be configured to sense an input by a user's body (e.g., a touch input from a user's hand) or to sense various external inputs, such as light, heat, and/or pressure. Furthermore, the input sensing unit 220 may also be configured to sense an input being in contact with or close to a sensing surface of the input sensing 220.

Although not shown, the display module 200 may further include an anti-reflection layer. The anti-reflection layer may include a color filter, a polarization film, and/or a phase retardation film.

The first flexible film 300 may be disposed near an edge region of the display module 200 to electrically connect the display module 200 to the circuit substrate 500. The first flexible film 300 may include a base film 310 and a driving chip 320. For example, the first flexible film 300 may be disposed at an edge region of the non-display region NDA and may be electrically connected to the display panel 210. As an additional example, the base film 310 may be disposed at the edge region of the non-display region NDA and may be electrically connected to the display panel 210.

The base film 310 may have a flexible property and may include a plurality of circuit lines. The base film 310 may have a quadrangular shape. However, the present inventive concept is not limited thereto. For example, the base film 310 may be disposed to have various shapes that are suitable for its purpose or may have a shape similar to that of the display device 1000.

The driving chip 320 may be disposed in the form of a chip-on-film (COF) and may be mounted on the base film 310. The driving chip 320 may include driving devices (e.g., a data driving circuit to be described below) for driving a pixel. Although the display device 1000 is illustrated to have one first flexible film 300, but the inventive concept is not limited thereto. For example, a plurality of the first flexible films 300 may be coupled to the display panel 210.

The second flexible film 400 may be disposed at an edge region of the input sensing unit 220 and at an edge of the circuit substrate 500. The second flexible film 400 may be configured to electrically connect the input sensing unit 220 to the circuit substrate 500. The second flexible film 400 may be flexible and may include a plurality of circuit lines. The second flexible film 400 may be used to transmit input sensing signals from the circuit substrate 500 to the input sensing unit 220.

In an exemplary embodiment of the present inventive concept, the second flexible film 400 may include a base film.

The circuit substrate 500 may include a base circuit substrate 510 and a driving device 520. The base circuit substrate 510 may be electrically connected to the display panel 210 through the first flexible film 300 and may be electrically connected to the input sensing unit 220 through the second flexible film 400. The base circuit substrate 510 may be a flexible printed circuit board (FPCB).

The driving device 520 may include a signal control unit (e.g., a timing controller). The signal control unit may be configured to receive image signals and then to convert the image signals to image data, which are used to operate the pixels. In addition, the signal control unit may also be configured to process various other control signals (e.g., a vertical synchronization signal, a horizontal synchronization signal, a main clock signal, and a data enable signal).

The driving device 520 may further include a circuit part, which is used to control the input sensing unit, but the present inventive concept is not limited thereto.

The substrates 600 may include a first substrate 610, a second substrate 620, and a third substrate 630. The substrates 600 may be disposed on surfaces V2 of the first and second flexible films 300 and 400 (e.g., see FIG. 2A) and may be used to support the first and second flexible films 300 and 400. Thus, the substrates 600 may be formed of or include a relatively rigid material, compared with the flexible films 300 and 400. For example, the substrates 600 may be formed of or include at least one of plastic or metallic materials.

The first substrate 610 may be disposed on a connection region where the display panel 210 and the first flexible film 300 are connected to each other. For example, the first substrate 610 may be disposed to overlap the connection region between the display panel 210 and the first flexible film 300, when viewed in a plan view. When viewed in a plan view, the second substrate 620 may be disposed to overlap a connection region where the first flexible film 300 and the circuit substrate 500 are connected to each other, and the third substrate 630 may be disposed to overlap a connection region where the second flexible film 400 and the circuit substrate 500 are connected to each other. The first substrate 610 and the second substrate 620 may be electrically disconnected or separated from the display panel 210 and the circuit substrate 500, respectively, by the base film 310. The third substrate 630 may be electrically disconnected from the input sensing unit 220 and the circuit substrate 500 by the second flexible film 400.

However, the present inventive concept is not limited thereto. For example, in an exemplary embodiment of the present inventive concept, the display device 1000 may be configured to include a single substrate, from which at least one of the substrates 600 is omitted.

The container member 700 may be configured to contain the display module 200. The container member 700 may be coupled to the window member 100 to form an outer appearance of the display device 1000. For example, the container member 700 coupled with the window member 100 may form a housing for the display module 200. The container member 700 may be configured to absorb impact exerted from the outside and to prevent a contamination material or moisture from infiltrating the display module 200, thereby protecting internal elements in the container member 700. Although not shown, the container member 700 may be configured to include a plurality of container members that are coupled to each other.

Figure 2B:
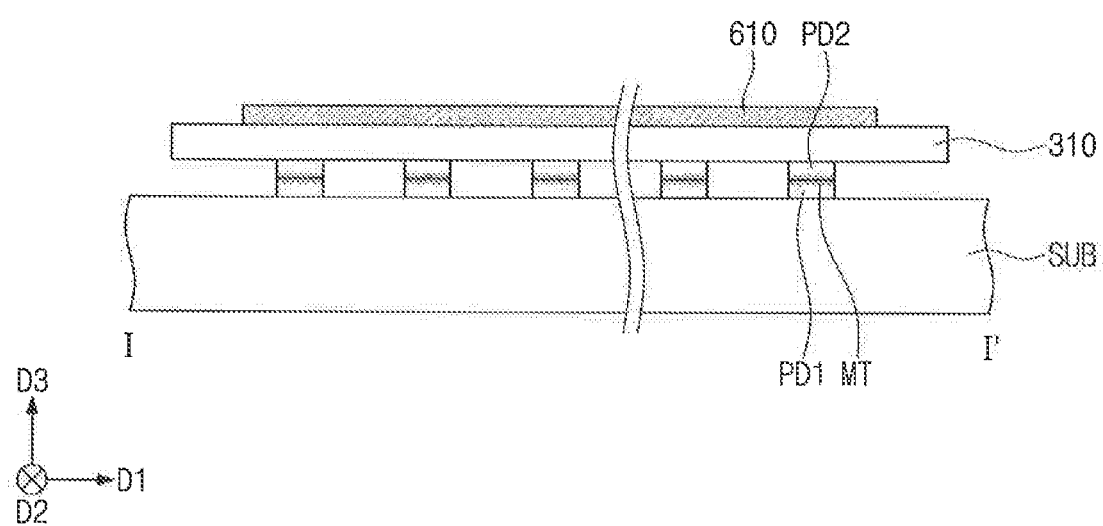
FIG. 2B is a sectional view illustrating a portion of a display device according to an exemplary embodiment of the present inventive concept.

FIG. 2A is a perspective view illustrating a portion of a display device according to an exemplary embodiment of the present inventive concept. FIG. 2B is a sectional view taken along line I-I' of FIG. 2A. To provide better understanding of the present inventive concept, FIG. 2A illustrates a structure, in which the display panel 210 and the first flexible film 300 are separated from each other, whereas FIG. 2B illustrates a structure, in which the display panel 210 and the first flexible film 300 are coupled to each other. Hereinafter, a display device according to an exemplary embodiment of the present inventive concept will be described in more detail with reference to FIGS. 2A and 2B.

As shown in FIG. 2A, the pixel pad portion PDL disposed on an edge region of the display panel 210 may include a plurality of pixel pads PD1 connected to the signal lines SGL, respectively.

The base film 310 of the first flexible film 300 may include a surface V1 and an opposite surface V2 facing the surface V1. The surface V1 may be a surface facing the base substrate SUB, and in the present embodiment, the surface V1 may be a rear (or, e.g., a bottom) surface of the base film 310.

The base film 310 may include an output pad portion PDO disposed on the surface V1. The output pad portion PDO may include a plurality of output pads PD2. The output pads PD2 may be respectively coupled to the pixel pads PD1 of the pixel pad portion PDL, when viewed in a plan view.

The first substrate 610 may be disposed on the opposite surface V2 of the base film 310. The first substrate 610 may be coupled to the base film 310 by an adhesive layer. The first substrate 610 may overlap the output pad portion PDO with the output pads PD2, when viewed in a plan view. A region where the first substrate 610 may be disposed, may be a region disposed with the output pads PD2. The first substrate 610 may be electrically disconnected from the output pad portion PDO by the base film 310.

The pixel pads PD1 of the pixel pad portion PDL may be respectively coupled to the output pads PD2 of the output pad portion PDO. A bonding portion MT between each coupled pair of the pads may be formed of a material different from the pixel and output pads PD1 and PD2. In an exemplary embodiment of the present inventive concept, the bonding portion MT may be formed of an alloy containing at least a portion of each of the pixel and output pads PD1 and PD2. For example, when an ultrasonic wave bonding method is used to bond the pixel pads PD1 to the output pads PD2, a portion of each of the pixel and output pads PD1 and PD2 may be melted to form a different material from the pixel and output pads PD1 and PD2. The ultrasonic wave bonding method will be described in more detail below.

The first substrate 610 may suppress a slip phenomenon, which may occur when the ultrasonic wave bonding step is performed. For example, since the first flexible film 300 is formed of a flexible material, the first flexible film 300 may be easily deformed by a heat and vibration energy to be supplied during the ultrasonic wave bonding step. As a result, an area (e.g., see FIG. 8B) of a bonding region of the first flexible film 300, which is in contact with an ultrasonic wave device (e.g., see FIG. 7G), may be gradually decreased as the ultrasonic wave bonding step is performed. According to an exemplary embodiment of the present inventive concept, the first substrate 610 may prevent the ultrasonic wave device from being in direct contact with the flexible films. Thus, the area of the bonding region may be prevented from being decreased in the ultrasonic wave bonding step, and thereby, prevent the slip phenomenon. As a result, contact reliability is increased between the pads and thereby to realize a highly efficient display device.

Figure 3B:
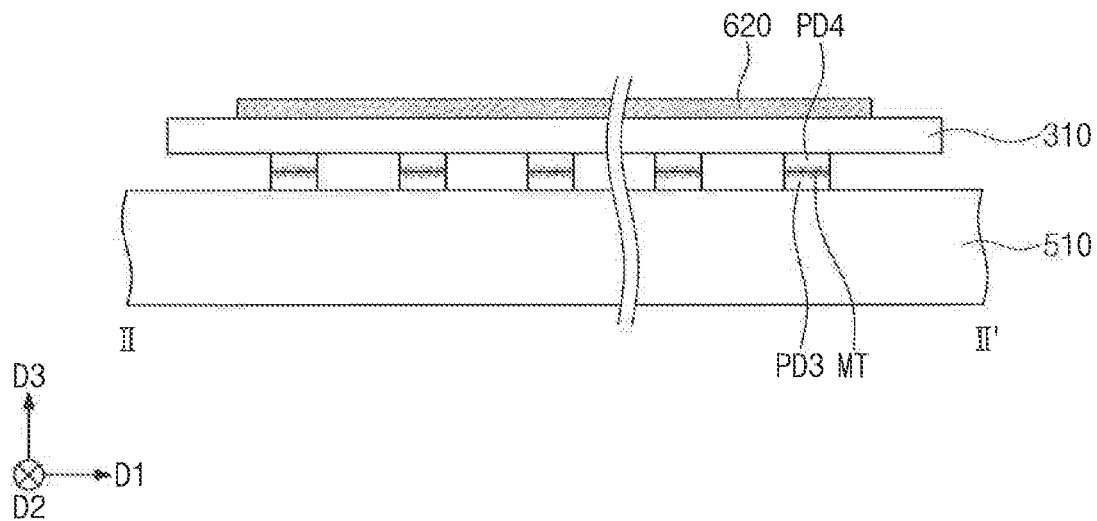
FIG. 3B is a sectional view illustrating a portion of a display device according to an exemplary embodiment of the present inventive concept.

FIG. 3A is a perspective view illustrating a portion of a display device according to an exemplary embodiment of the present inventive concept. FIG. 3B is a sectional view illustrating a portion of a display device according to an exemplary embodiment of the present inventive concept.

As shown in FIG. 3A, the base circuit substrate 510 may include a first driving pad portion PDC1 (e.g., see FIG. 3A) disposed in an edge region thereof. The first driving pad portion PDC1 may include a plurality of first driving pads PD3.

The base film 310 may include an input pad portion PDI disposed on a surface V1 of the base film 310. The input pad portion PDI may be disposed to be spaced apart from the output pad portion PDO. The input pad portion PDI may include a plurality of input pads PD4. The input pads PD4 may be coupled to the first driving pads PD3, respectively.

The second substrate 620 may be disposed on an opposite surface of the base film 310. The second substrate 620 may be spaced apart from the first substrate 610. For example, the second substrate 620 may be on one end of the base film 310, and the first substrate 610 may be on another end of the base film 310. The second substrate 620 may be coupled to the base film 310 by an adhesive material.

FIG. 3B is a sectional view of bonding regions between the first driving pads PD3 and the input pads PD4, taken along line II-II' of FIG. 3A. In an exemplary embodiment of the present inventive concept, the second substrate 620 may be disposed on the base film 310 such that it overlaps the input pads PD4.

Figure 3C:
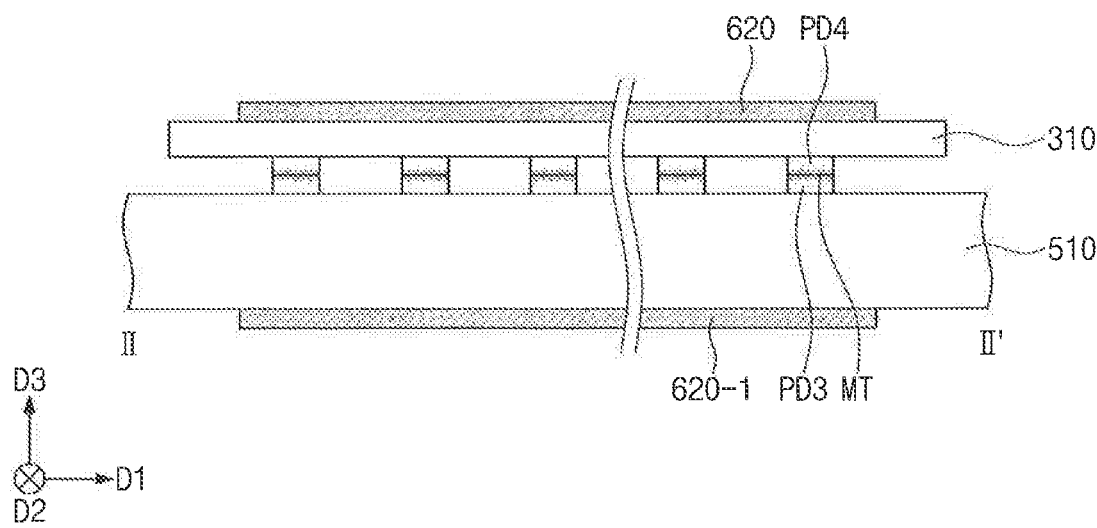
FIG. 3C is a sectional view illustrating a portion of a display device according to an exemplary embodiment of the present inventive concept.

FIG. 3C is a sectional view illustrating a portion of a display device according to an exemplary embodiment of the present inventive concept.

In an exemplary embodiment of the present inventive concept, an additional substrate 620-1 having a rigid property may be disposed on the base circuit substrate 510. The additional substrate 620-1 may be disposed on a surface of the base circuit substrate 510 opposite to that of the first driving pads PD3. The additional substrate 620-1 may be disposed on a region that is overlapped with the first driving pad portion PDC1 (e.g., see FIG. 3A) of the base circuit substrate 510, when viewed in a plan view. The additional substrate 620-1 may be electrically disconnected from the input pad portion PDI by the base circuit substrate 510.

In an exemplary embodiment of the present inventive concept, the circuit substrate 500 may be a flexible printed circuit board (FPCB). Since the additional substrate 620-1 having a rigid property is disposed on the circuit substrate 500 made of a flexible material, the slip phenomenon between the first driving pads PD3 and the input pads PD4 in the ultrasonic wave bonding step may be prevented or suppressed. For example, heat and vibration energy, which is produced during the ultrasonic wave bonding step, may be supplied to a lower portion of the circuit substrate 500, and thus, the circuit substrate 500 may be deformed to cause a reduction in an area of a contact region between the circuit substrate 500 and the ultrasonic wave device (e.g., see FIG. 7G), as shown in FIG. 8B. Since the additional substrate 620-1 is disposed to support the circuit substrate 500, deformation of the circuit substrate 500 by heat and vibrational energy may be suppressed or prevented.

Figure 4A:
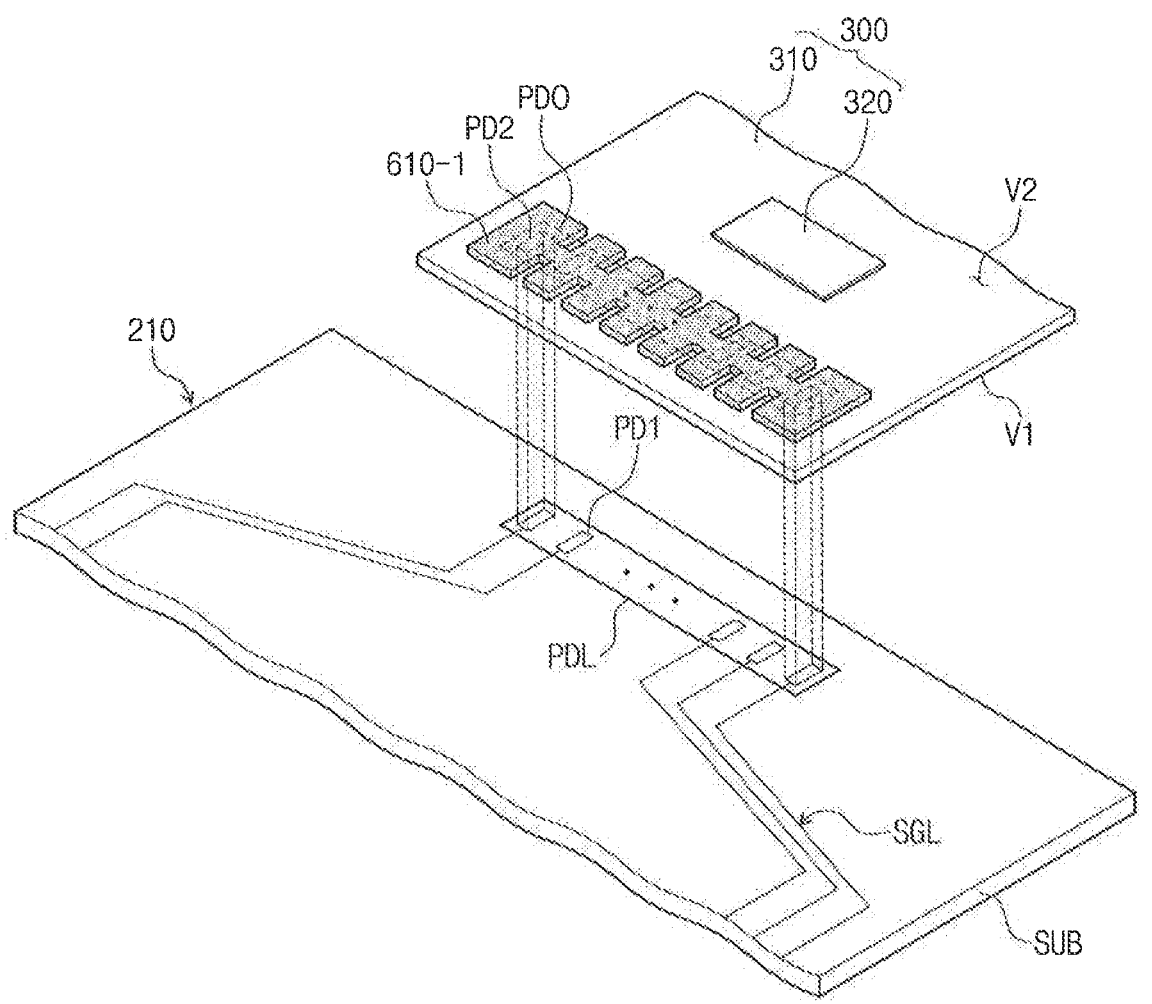
FIG. 4A is a perspective view illustrating a portion of a display device according to an exemplary embodiment of the present inventive concept.
Figure 4B:
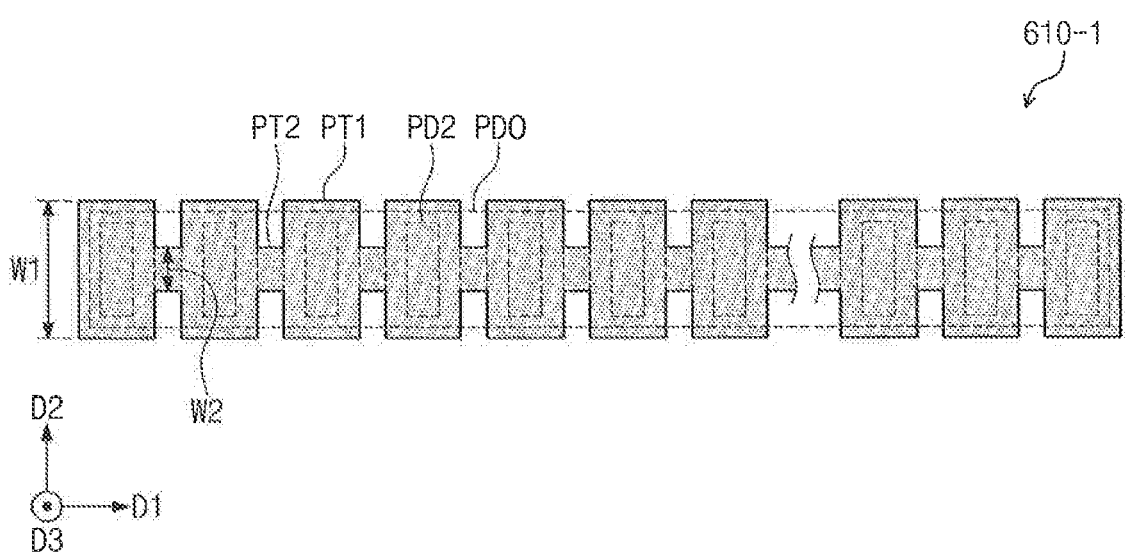
FIG. 4B is an enlarged plan view illustrating a substrate according to an exemplary embodiment of the present inventive concept.

FIG. 4A is a perspective view illustrating a portion of a display device according to an exemplary embodiment of the present inventive concept. FIG. 4B is an enlarged plan view illustrating a substrate according to an exemplary embodiment of the present inventive concept. For concise description, an element previously described with reference to FIGS. 2A to 2B may be identified by the same reference number without repeating an overlapping or repetitive description thereof.

A first substrate 610-1 disposed on the surface V2 of a base film 310 may have an uneven shape. For example, the first substrate 610-1 may have an alternating width. The first substrate 610-1 may include a plurality of first patterns PT1, which are arranged in the first direction D1 and have a first width W1 in the second direction D2. In addition, the first substrate 610-1 may include a plurality of second patterns PT2, each of which has a second width W2 smaller than the first width W1 in the second direction D2, and here, the first and second patterns PT1 and PT2 may be alternately arranged in the first direction.

When viewed in a plan view, the first patterns PT1 may be aligned to and overlapped with the output pads PD2, respectively, and the second patterns PT2 may be disposed between and aligned to the first patterns PT1. For example, the second patterns PT2 may be disposed between the output pads PD2 that are spaced apart from each other. The first patterns PT1 may be disposed at substantially the same regions as the output pads PD2, respectively. Thus, although it may difficult to know positions of the first patterns PT1 during the pad bonding step (e.g., bonding the output pads PD2 to the pixel pads PD1), the positions of the first patterns PT1 may be easily known by using the first substrate 610-1, and thereby, predict positions of the pads. Accordingly, misalignment of the pads with each other may be prevented when the pad bonding step is performed, even when an additional alignment mark is not disposed. For example, an alignment accuracy may be increased, and thereby, increase contact reliability between pads in a display device.

Figure 5A:
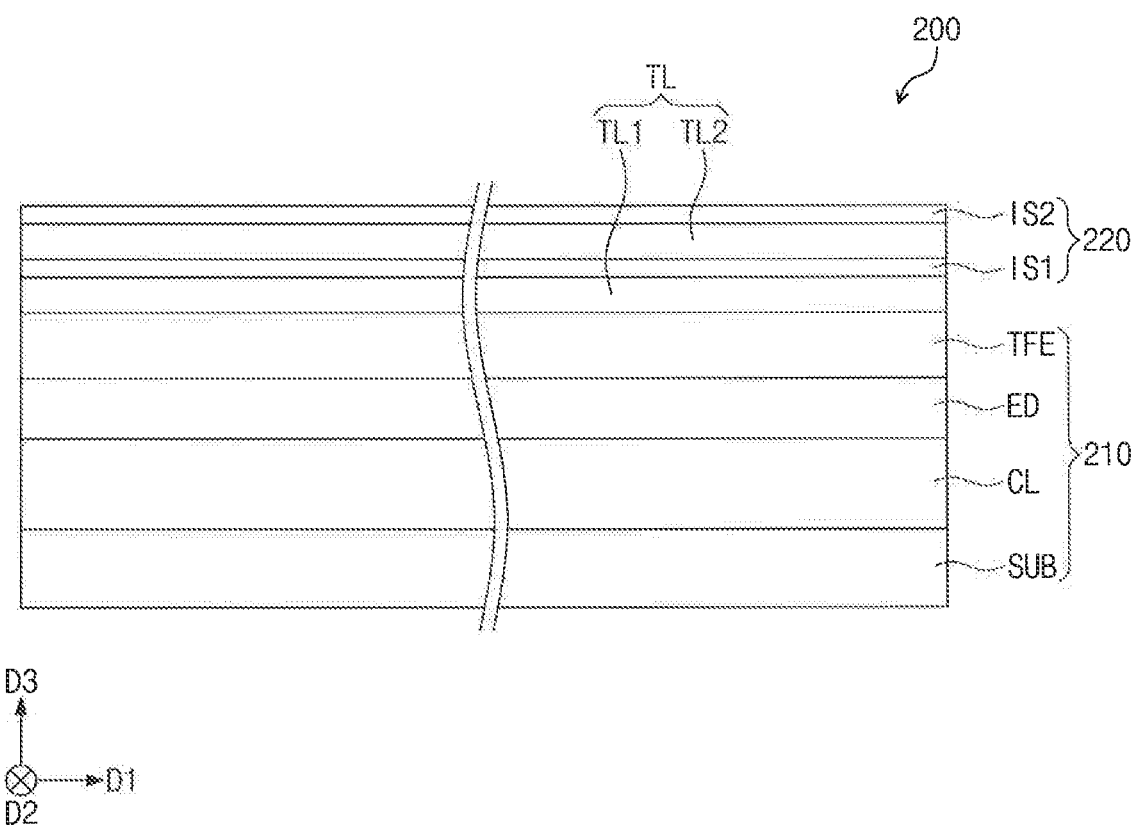
FIG. 5A is a sectional view illustrating a display device according to an exemplary embodiment of the present inventive concept.
Figure 5B:
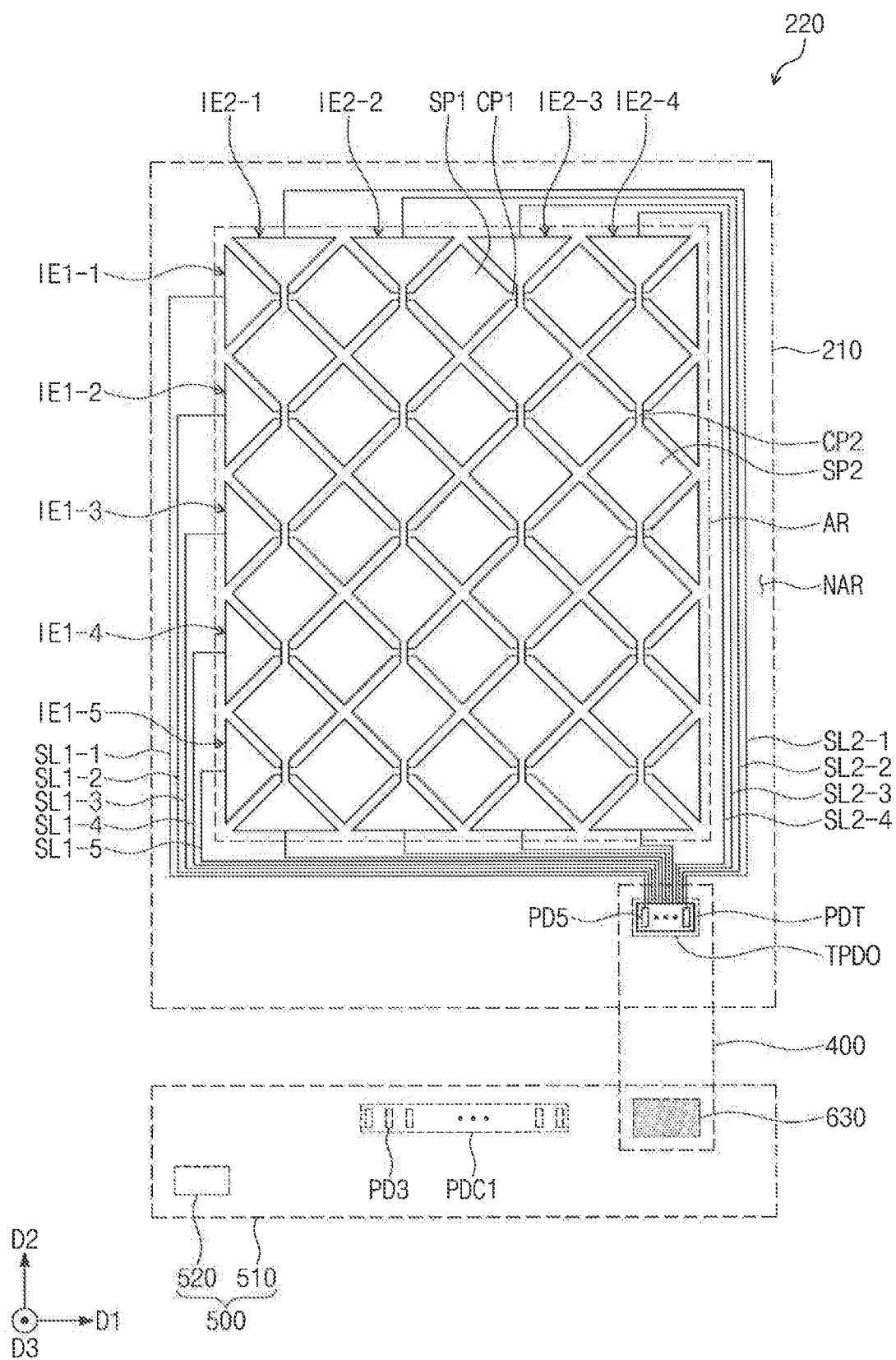
FIG. 5B is a plan view of an input sensing unit of FIG. 5A.
Figure 5C:
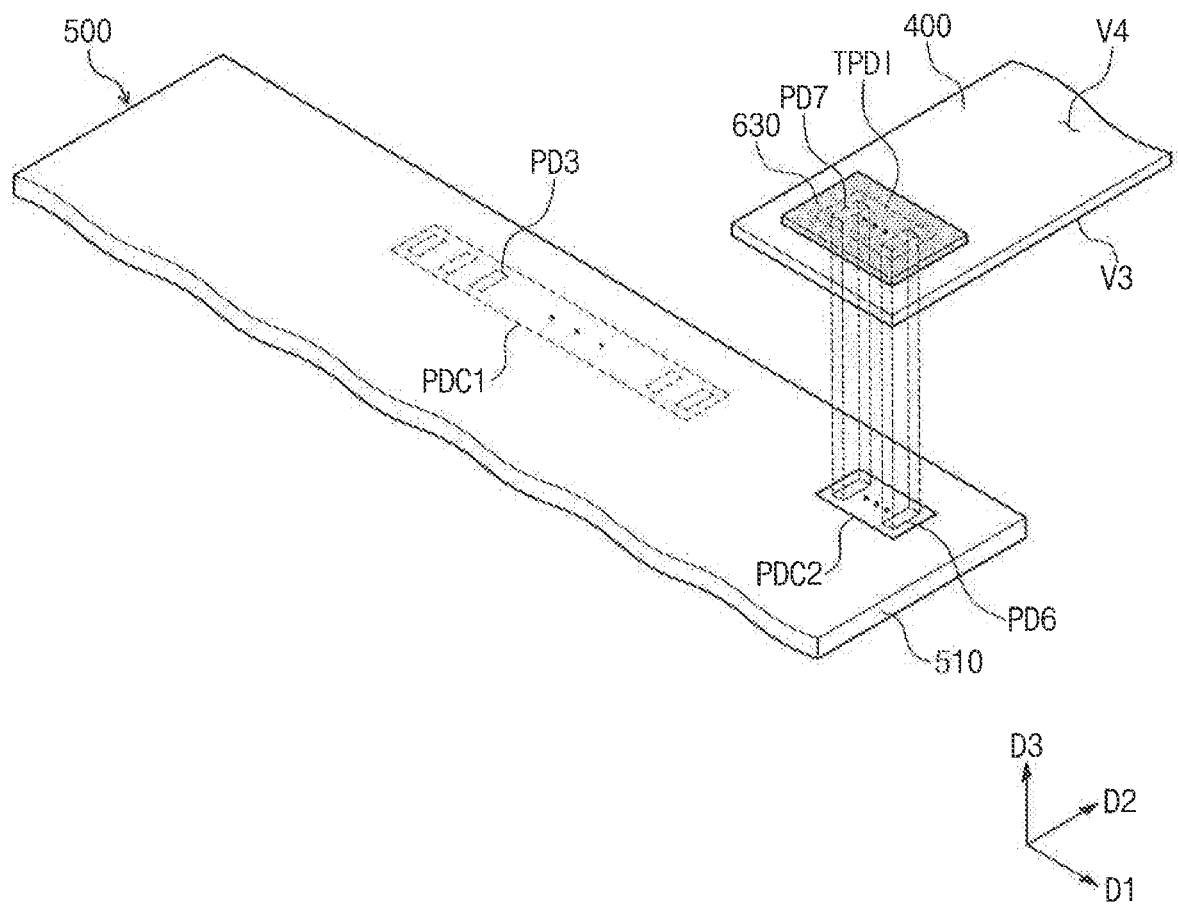
FIG. 5C is a perspective view illustrating a portion of a display device according to an exemplary embodiment of the present inventive concept.

FIG. 5A is a sectional view illustrating a display device according to an exemplary embodiment of the present inventive concept. FIG. 5B is a plan view of an input sensing unit of FIG. 5A. FIG. 5C is a perspective view illustrating a portion of a display device according to an exemplary embodiment of the present inventive concept. For convenience in description, peripheral elements of the input sensing unit 220 are illustrated by a dotted line in FIG. 5B, and the circuit substrate 500 and the second flexible film 400 are illustrated to be spaced apart from each other in FIG. 5C.

As shown in FIG. 5A, the input sensing unit 220 may be disposed on the encapsulation layer TFE of the display panel 210. For example, the input sensing unit 220 may be directly formed on the top surface of the encapsulation layer TFE. For example, there may be no adhesive layer between the input sensing unit 220 and the encapsulation layer TFE.

The input sensing unit 220 may include a touch sensor TL and a plurality of insulating layers IS1 and IS2. The touch sensor TL may include a first conductive layer TL1 and a second conductive layer TL2. The first conductive layer TL1 may be disposed on the encapsulation layer TFE. A first insulating layer IL1 may be disposed on the first conductive layer TL1, the second conductive layer TL2 may be disposed on the first insulating layer IL1, and a second insulating layer IL2 may be disposed on the second conductive layer TL2. Each of the first and second conductive layers TL1 and TL2 may have a single-layered structure or a multi-layered structure, in which a plurality of layers are stacked in the third direction DR3.

As shown in FIG. 5B, the input sensing unit 220 may include an active region AR, which is disposed to correspond to the display region DA of FIG. 1A and is configured to sense an external input, and a non-active region NAR, which is disposed to at least partially surround the active region AR. For example, the non-active region NAR may correspond to the non-display region NDA. As an additional example, the non-active region NAR may enclose the active region AR.

The first conductive layer TL1 of the touch sensor TL may include first sensing electrodes IE1-1 to IE1-5 and first signal lines SL1-1 to SL1-5, which are connected to the first sensing electrodes IE1-1 to IE1-5, and the second conductive layer TL2 may include second sensing electrodes IE2-1 to IE2-4 and second signal lines SL2-1 to SL2-4, which are connected to the second sensing electrodes IE2-1 to IE2-4.

The first sensing electrodes IE1-1 to IE1-5 and the second sensing electrodes IE2-1 to IE2-4 may be disposed to cross each other. The first sensing electrodes IE1-1 to IE1-5 may be arranged in the second direction DR2 and may extend in the first direction DR1. In an exemplary embodiment of the present inventive concept, the input sensing unit 220 may be configured to sense an external input (e.g., a touch input) in a mutual-capacitance and/or self-capacitance manner.

Each of the first sensing electrodes IE1-1 to IE1-5 may include first sensor units SP1 and first connecting portions CP1. Each of the second sensing electrodes IE2-1 to IE2-4 may include second sensor units SP2 and second connecting portions CP2. Two first sensor units SP1, which are located at opposite ends of a first sensing electrode (e.g., IE1-1 to IE1-5), may have a small area or size (e.g., a half area), compared with a central first sensor unit SP1 and/or a first sensor unit SP1 located between the first sensor units SP1 at opposite ends of the first sensing electrode (e.g., IE1-1 to IE1-5). Two second sensor units SP2, which are located at opposite ends of a second sensing electrode (e.g., IE2-1 to IE2-4), may have a small area or size (e.g., half area), compared with a central second sensor unit SP2 and/or a second sensor unit SP2 located between the second sensor units SP2 at opposite ends of the second sensing electrode (e.g., IE2-1 to IE2-4).

In an exemplary embodiment of the present inventive concept, the first sensing electrodes IE1-1 to IE1-5 and the second sensing electrodes IE2-1 to IE2-4 may have a shape (e.g., a bar shape), which does not allow a sensor unit to be distinguished from a connecting portion. Although the first sensor units SP1 and the second sensor units SP2 are illustrated to have a diamond shape, the present inventive concept is not limited thereto. For example, the first sensor units SP1 and the second sensor units SP2 may have a polygonal shape.

The first signal lines SL1-1 to SL1-5 and the second signal lines SL2-1 to SL2-4 may overlap the active region AR and the non-active region NAR. The first signal lines SL1-1 to SL1-5 and the second signal lines SL2-1 to SL2-4 may be connected to a touch pad portion PDT overlapped with the non-active region NAR. The touch pad portion PDT may include a plurality of touch pads PD5.

A rear surface V3 of the second flexible film 400 may include a touch output pad portion TPDO and a touch input pad portion TPDI. The touch output pad portion TPDO may be electrically connected to the input sensing unit 220. The touch output pad portion TPDO may include a plurality of touch output pads, which are coupled to the touch pads PD5 of the touch pad portion PDT in the non-active region NAR, respectively. Although not shown, the touch output pads may be physically and electrically coupled to respective ones of the touch pads PD5 through a coupling member such as an anisotropic conductive film (ACF).

The touch input pad portion TPDI may be electrically connected to the circuit substrate 500. The touch input pad portion TPDI may include a plurality of touch input pads PD7, which are coupled to the circuit substrate 500.

The circuit substrate 500 may further include a second driving pad portion PDC2, which is spaced apart from the first driving pad portion PDC1 and is electrically coupled to the touch input pad portion TPDI of the second flexible film 400.

Thus, the input sensing unit 220 and the circuit substrate 500 may be electrically connected to the second flexible film 400, and the input sensing circuit 200 may receive a driving signal, which is output from an input sensing circuit mounted on the circuit substrate 500, through the second flexible film 400. In addition, the second flexible film 400 may transmit the driving signal to the first signal lines SL1-1 to SL1-5 and the second signal lines SL2-1 to SL2-4.

As shown in FIG. 5C, the second driving pad portion PDC2 may include a plurality of second driving pads PD6. The touch input pads PD7 may be coupled to the second driving pads PD6, respectively.

In an exemplary embodiment of the present inventive concept, the third substrate 630 may be disposed on a region where the second driving pad portion PDC2 and the touch input pad portion TPDI are coupled to each other, when viewed in a plan view. The third substrate 630 may be disposed on a top surface V4 of the second flexible film 400. The third substrate 630 may be configured to support the second flexible film 400.

According to an exemplary embodiment of the present inventive concept, each of the substrates 600 (e.g., 610, 620 and 630) may be disposed at an edge region of a corresponding one of the flexible films 300 and 400. Accordingly, excessive vibration and a consequent slip failure between the pads of the flexible film and the display panel or circuit substrate may be suppressed, which may occur in the pad bonding step using the ultrasonic wave device (e.g., see FIG. 7G). In the case where a flexible film or a circuit substrate is vibrated by an ultrasonic wave device, a region, on which the pads are not disposed, may be deformed, and this may lead to a reduction in a contact area between the ultrasonic wave device and the flexible film or circuit substrate, as shown in FIG. 8B. Thus, pressure and vibration energy supplied from the ultrasonic wave device may be partly lost, thereby causing a contact failure between the pads. By increasing an area of a region in contact with the ultrasonic wave device as shown in FIG. 8A, the loss of the pressure and vibration energy may be reduced, and thereby, prevent the slip failure between the pads. In the case of the display device 1000 including the substrates 600, bonding or coupling reliability between the pads may be increased, and thereby, provide a display device 1000 with increased connectivity.

FIG. 6 is a block diagram illustrating a method of fabricating a display device according to an exemplary embodiment of the present inventive concept.

Figure 7A:
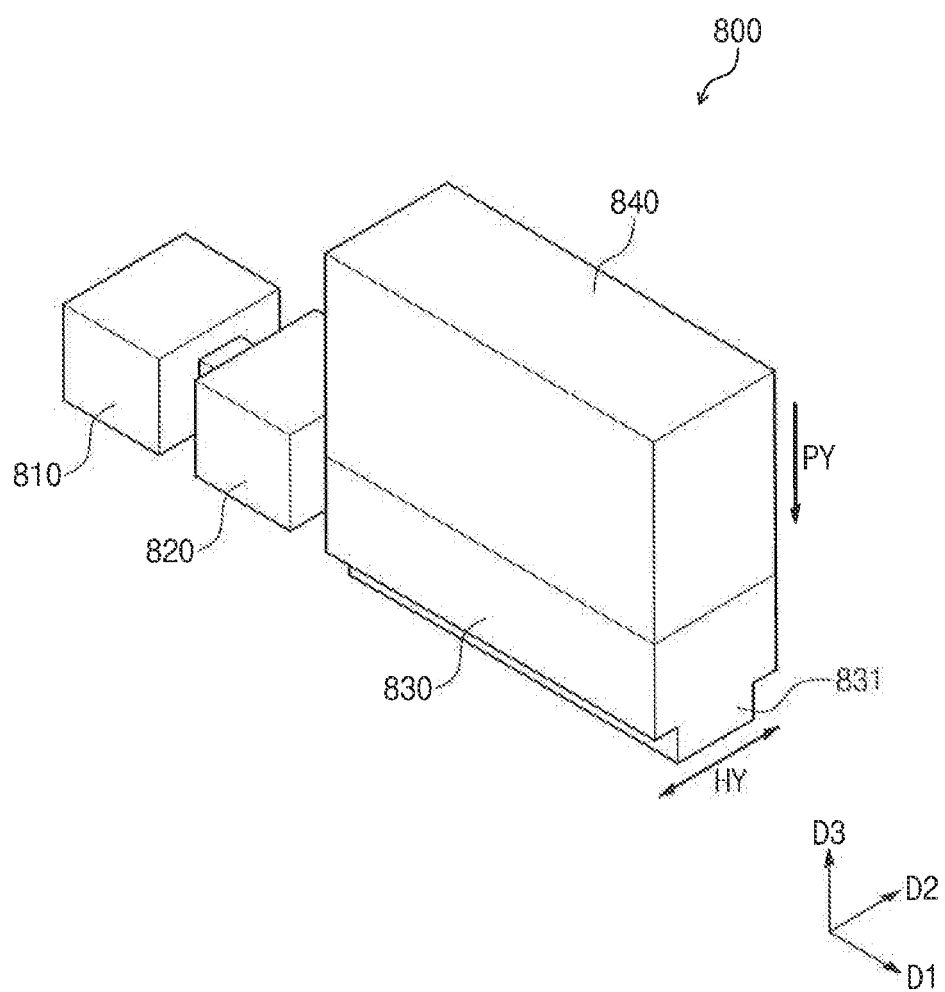
FIG. 7A is a perspective view illustrating an ultrasonic wave device according to an exemplary embodiment of the present inventive concept.

FIG. 7A is a perspective view illustrating an ultrasonic wave device according to an exemplary embodiment of the present inventive concept. FIGS. 7B to 7H are diagrams illustrating a method of fabricating a display device according to an exemplary embodiment of the present inventive concept. A method of fabricating a display device, according to an exemplary embodiment of the present inventive concept, will be described in more detail with reference to FIGS. 6 to 7H. For concise description, an element previously described with reference to FIGS. 1A to 5C may be identified by the same reference number without repeating an overlapping or repetitive description thereof.

As shown in FIG. 6, a method of fabricating a display device 2000 may include a display panel providing step S100, a flexible film providing step S200, a first aligning step S300, a first bonding step S400, a circuit substrate providing step S500, a second aligning step S600, and a second bonding step S700.

An ultrasonic wave device 800 shown in FIG. 7A may be used for a method of fabricating a display device, according to an exemplary embodiment of the present inventive concept. The ultrasonic wave device 800 may include a generating part 810, an amplifying part 820, a vibrating part 830, and a pressing part 840.

In the ultrasonic wave device 800, the generating part 810 may be configured to cause an initial vibrational motion, whose amplitude ranges from 1 µm to 3 µm. The vibration energy of the initial vibration motion caused by the generating part 810 may be transferred to the amplifying part 820, and the amplifying part 820 may be configured to amplify the amplitude or energy of the vibrational motion by five to ten times. The vibration energy amplified by the amplifying part 820 may be transferred to the vibrating part 830. The vibrating part 830 may be configured to cause a horizontal motion HY in the second direction D2 using the amplified vibration energy transferred through the amplifying part 820. The vibrating part 830 may include a protruding portion 831. The vibrating part 830 may be configured to provide the vibration energy to a region of the circuit substrate, which overlaps the protruding portion 831 when viewed in a plan view.

The pressing part 840 may be disposed on the vibrating part 830 to effectively transfer the vibration energy from the vibrating part 830 to pads. For example, in a process of bonding the pads, the vibrating part 830 may be disposed on the substrates 600, and the vibrating part 830 may be pressed to the pads by the pressing part 840 in a pressing operation PY. The vibrating part 830 may be formed of or include at least one material having a high thermal conductivity. For example, the vibrating part 830 may be formed of or include at least one of metals or alloys (e.g., stainless steel).

As shown in FIGS. 6 and 7B, in the display panel providing step S100, the display panel 210 including a plurality of pixels PX (e.g., see FIG. 1C) and the signal lines SGL connected to the pixels PX may be disposed. The display panel 210 may include the pixel pad portion PDL electrically connected to the signal lines SGL. The pixel pad portion PDL may be disposed to include the pixel pads PD1.

Figure 7C:
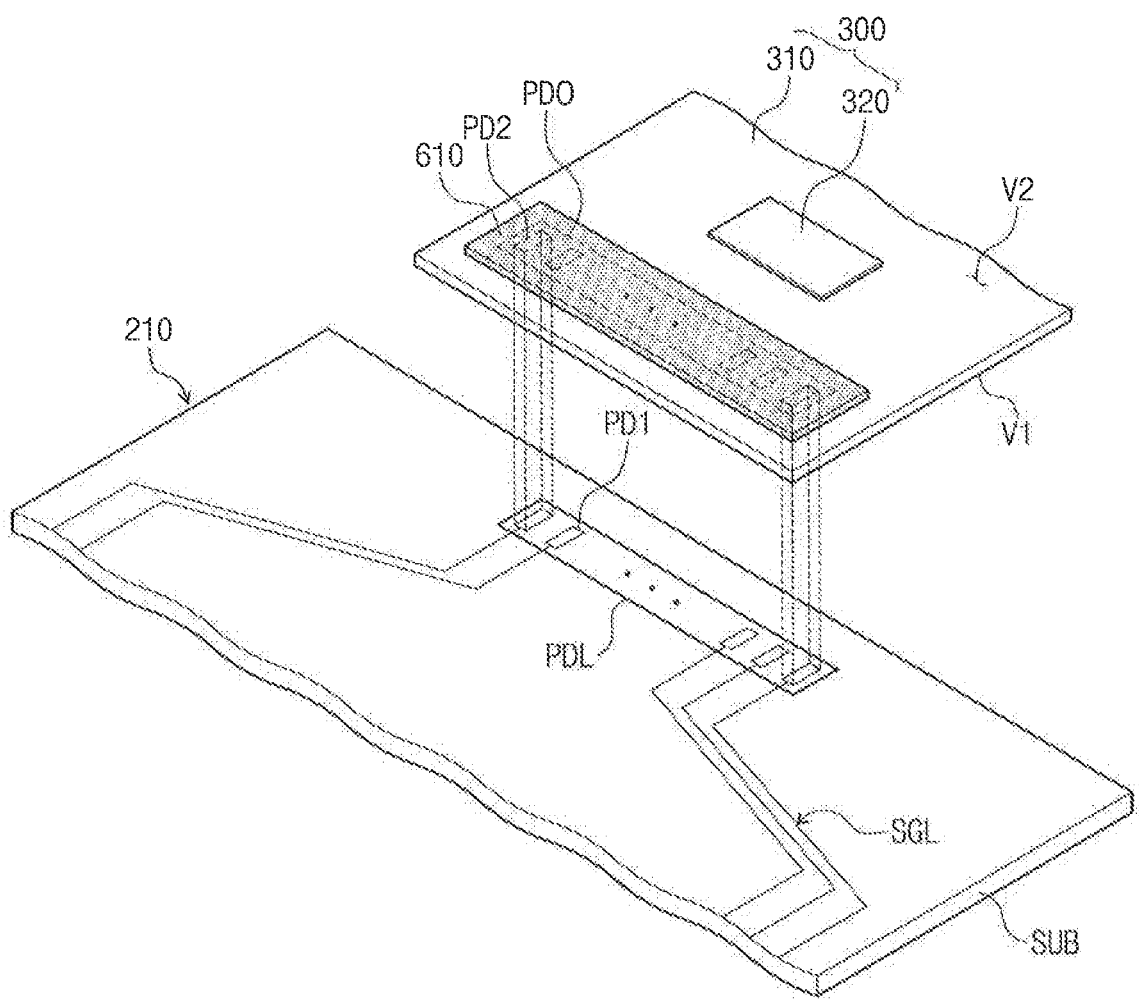

Thereafter, as shown in FIGS. 6 and 7C, in the flexible film providing step S200 and the first aligning step S300, a portion of the first flexible film 300 including the base film 310 may be disposed on the pixel pad portion PDL. The output pad portion PDO may be disposed on the surface V1 of the base film 310 to be overlapped with the pixel pad portion PDL. The output pad portion PDO may include the output pads PD2. To bond the pixel pads PD1 to the output pads PD2, respectively, the output pads PD2 may be aligned to the pixel pads PD1.

The first substrate 610 may be disposed on the opposite surface V2 of the base film 310. The first substrate 610 may overlap the output pad portion PDO, when viewed in a plan view.

Figure 7D:
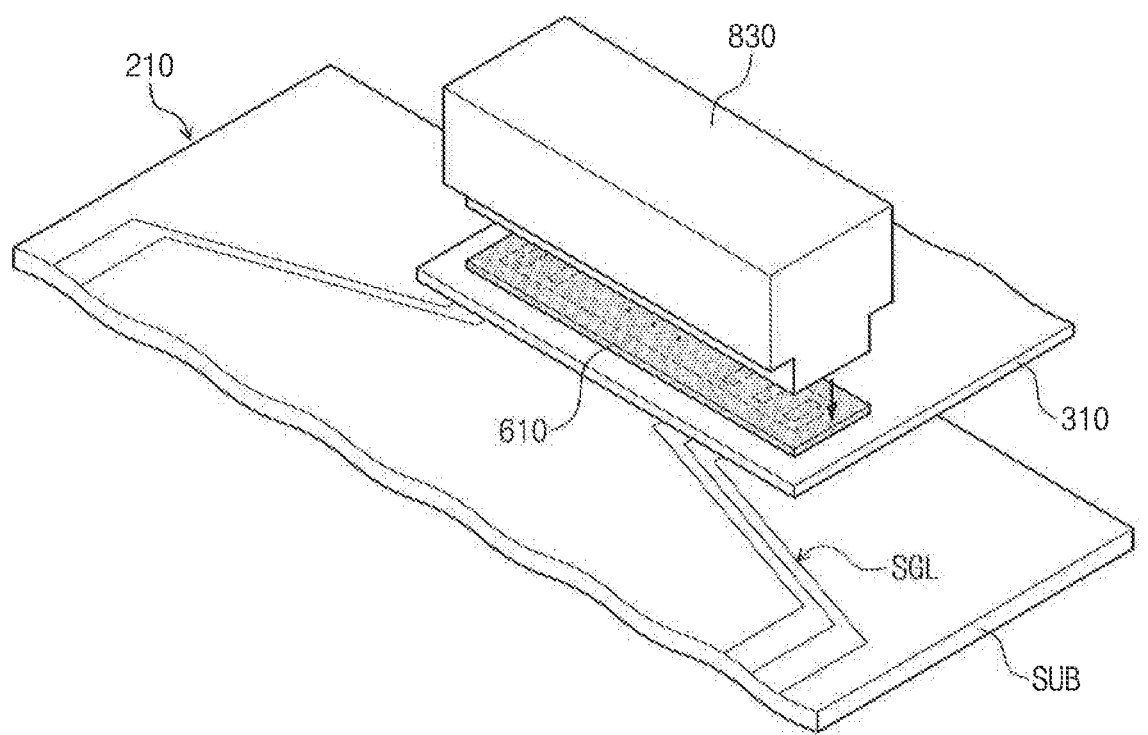
Figure 7E:
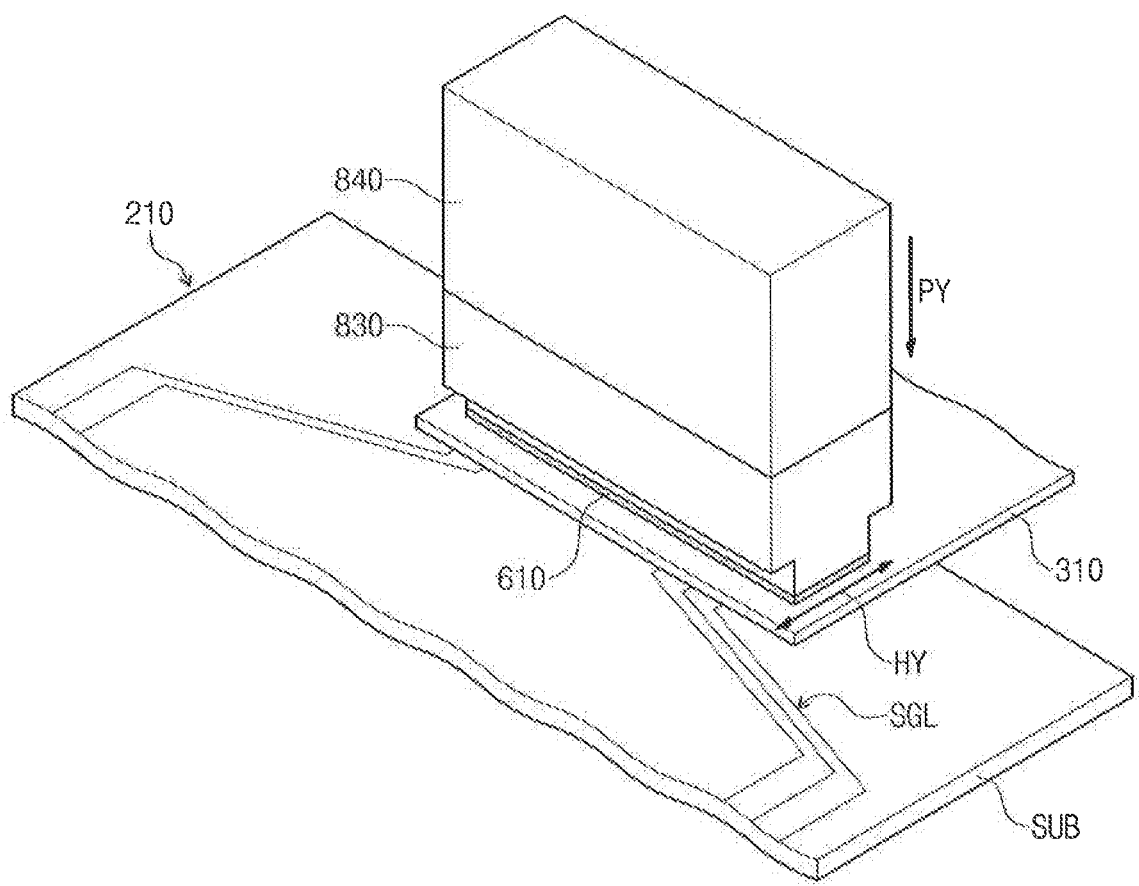

Thereafter, as shown in FIGS. 6, 7D, and 7E, the first bonding step S400 may include aligning the vibrating part 830 to the first substrate 610. Thereafter, the pressing part 840 may be used to perform the pressing operation PY of pressing the first substrate 610 with the vibrating part 830, and in this case, bonding of the pixel pads PD1 to the output pads PD2, respectively, may be performed using the vibration energy supplied from the amplifying part 820.

The first substrate 610 may be disposed between the vibrating part 830 and the first flexible film 300. Since the first substrate 610 is in direct contact with the protruding portion 831, direct contact between the protruding portion 831 and the first flexible film 300 may be prevented.

In an exemplary embodiment of the present inventive concept, the vibration energy supplied from the vibrating part 830 may be transferred to the pads, which are formed of different metallic materials and are pressed by the pressing part 840 in the pressing operation PY. Thus, at least a portion of each of the pixel and output pads PD1 and PD2 may be melted, and as a result, the pixel and output pads PD1 and PD2 may be bonded to each other.

Thereafter, as shown in FIGS. 6 and 7F, in the circuit substrate providing step S500 and the second aligning step S600, the circuit substrate 500 including the first driving pad portion PDC1 may be disposed. The first driving pad portion PDC1 may include a plurality of the first driving pads PD3.

The input pad portion PDI may be disposed on the surface V1 of the base film 310 to be overlapped with the first driving pad portion PDC1, and the input pad portion PDI may be spaced apart from the output pad portion PDO. The input pad portion PDI may include a plurality of the input pads PD4. The input pads PD4 may be aligned to the first driving pads PD3, respectively.

The second substrate 620 may be disposed on the opposite surface V2 of the base film 310 and may be spaced apart from the first substrate 610. The second substrate 620 may overlap the input pad portion PDI, when viewed in a plan view.

Figure 7G:
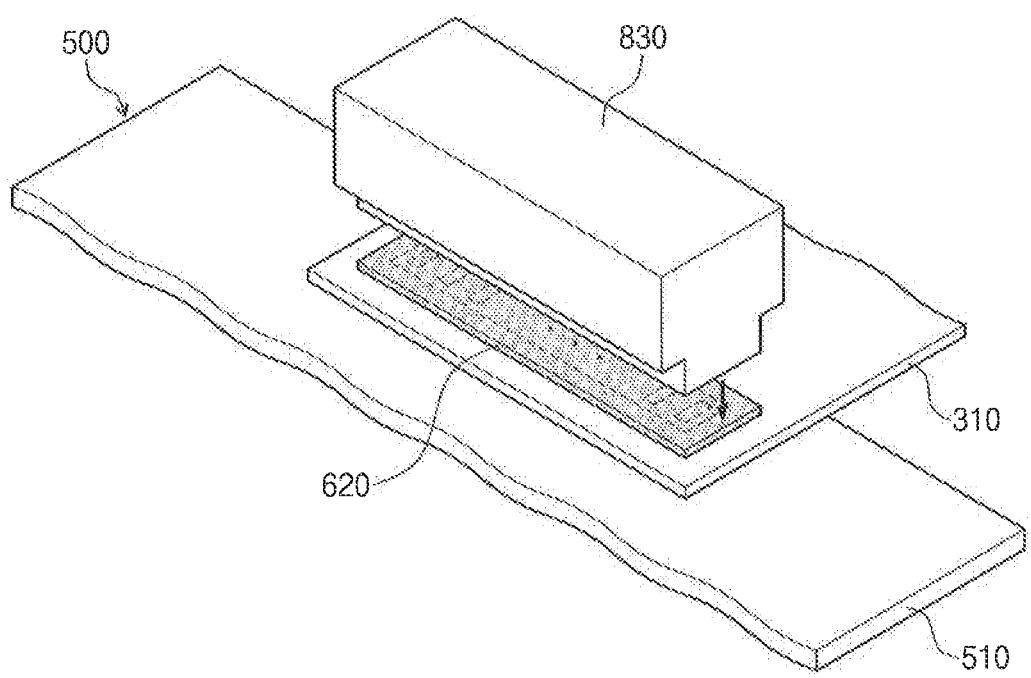
Figure 7H:
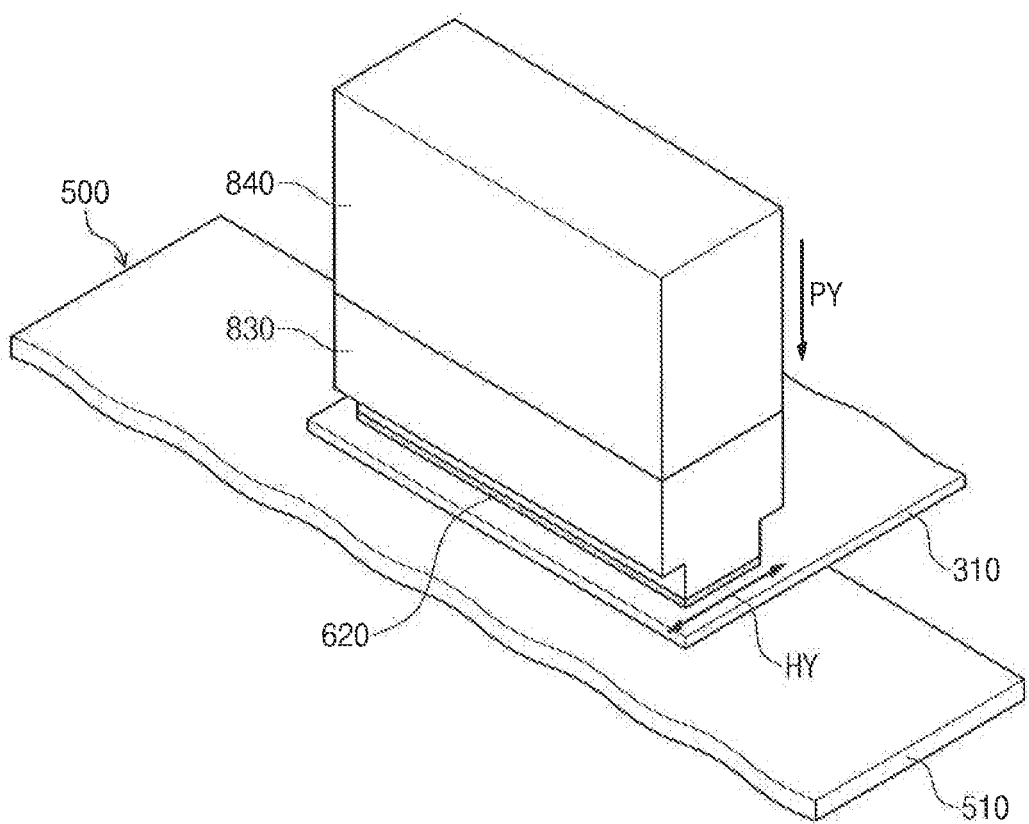
Figure 8A:
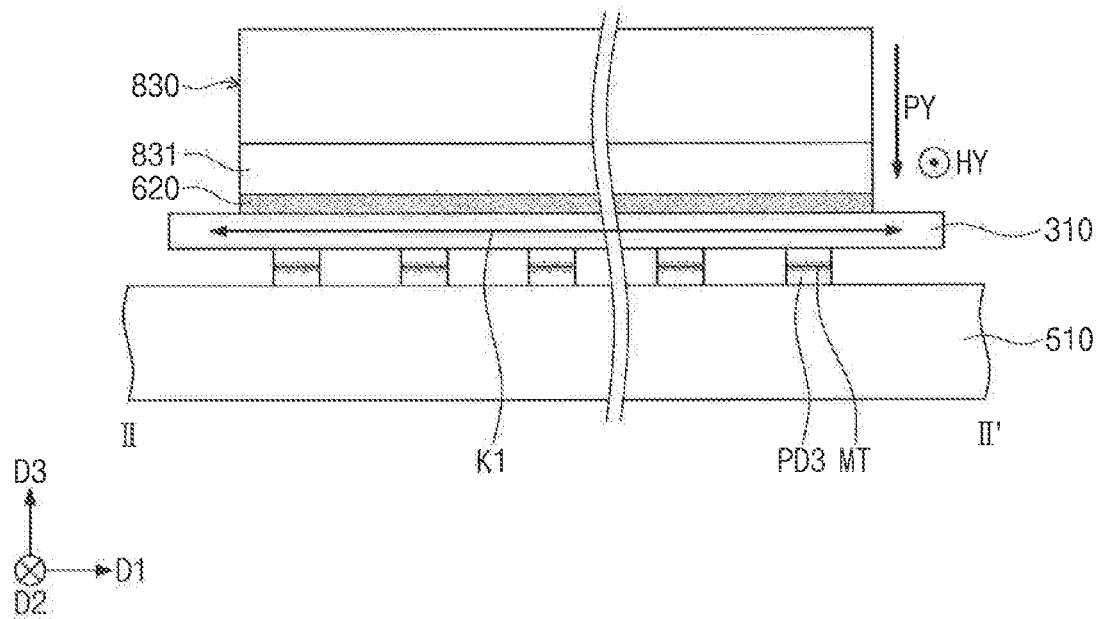
FIGS. 8A and 8B are sectional views illustrating a display device according to an exemplary embodiment of the present inventive concept.
Figure 8B:
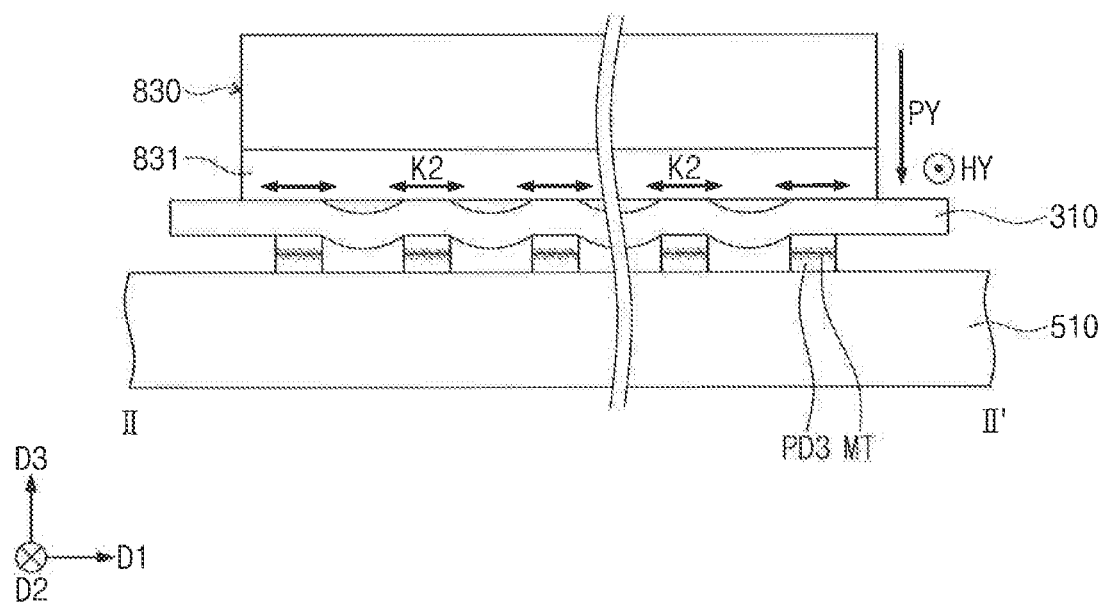

Next, as shown in FIGS. 6, 7G, and 7H, the second bonding step S700 may include aligning the vibrating part 830 to the second substrate 620. Thereafter, the pressing operation PY using the pressing part 840 may be performed to allow the vibrating part 830 to be in contact with a top surface of the second substrate 620, and in this case, the vibration energy supplied from the generating part 810 and the amplifying part 820 may be used to bond the first driving pads PD3 to the input pads PD4. The vibration energy supplied from the vibrating part 830 and the pressing operation PY of the pressing part 840 may be used to melt at least a portion of each of the first driving pads PD3 and the input pads PD4, and thus, the first driving pads PD3 may be bonded to the input pads PD4, respectively.

FIG. 8A is a sectional view illustrating a process of fabricating a display device, according to an exemplary embodiment of the present inventive concept, and FIG. 8B is a sectional view illustrating a process of fabricating a display device, according to a comparative example. For convenience in illustration, FIG. 8A illustrates the bonding step of FIG. 7H, and FIG. 8B illustrates the step corresponding to FIG. 8A. For convenience in description, technical features associated with the pressing part 840 may be omitted.

The sectional view of FIG. 8A illustrates a configuration, in which the second substrate 620 is disposed on the first flexible film 300 and the vibrating part 830 is used to perform the pressing operation PY on the display device 1000, and the sectional view of FIG. 8B illustrates a configuration, in which the protruding portion 831 of the vibrating part 830 is disposed to be in direct contact with the first flexible film 300 without the second substrate 620 present, and the pressing operation PY is performed on the display device 1000. Hereinafter, the present inventive concept will be described in more detail with reference to FIG. 8A and by means of comparison to FIG. 8B.

Referring to FIGS. 8A and 8B, the second substrate 620 and the protruding portion 831 may be disposed to be in direct contact with each other. Thus, the second substrate 620 may be used to transfer the pressing operation PY and the horizontal motion HY, which are performed by the ultrasonic wave device 800, to the pads. The larger the contact area between the ultrasonic wave device 800 and the flexible film, the smaller the loss of the energy supplied form the ultrasonic wave device 800. In the case where the second substrate 620 is disposed, a contact area of the display device 1000 may have a first width K1. By contrast, in the comparative example where the substrates 600 are not disposed, owing to the pressing operation PY and the horizontal motion HY by the ultrasonic wave device 800, the flexible substrates (e.g., the base film 310 of the flexible substrates) may be partially deformed, and thus, a contact area between the ultrasonic wave device 800 and each of the flexible films may have a second width K2, which is given by the sum of widths, in the first direction, of the pads. In other words, the first width K1 may be larger than the second width K2, and thus, the pressure and vibration energy from the ultrasonic wave device 800 may be transferred to the pads, in a process of fabricating the display device 1000 including the substrates 600. In other words, the loss of energy, in the energy transfer process to the pads, may be reduced. Furthermore, deformation of the flexible film may be prevented, and thus, a slip failure between the pads and the flexible film may be suppressed or prevented, and thereby, increase reliability in a process of fabricating a display device and provide a display device with increased connectivity between the pads.

According to an exemplary embodiment of the present inventive concept, since a substrate is attached on a flexible film, a slip phenomenon may be suppressed or prevented from occurring between pad portions of the flexible film and a display panel and a circuit substrate, which are bonded to each other, in an ultrasonic wave bonding step. Accordingly, contact reliability between pads may be increased.

While exemplary embodiments of the present inventive concept have been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display device, comprising:
 a display panel including a plurality of pixels that display an image, and a pixel pad portion connected to the pixels;
 a first flexible film electrically connected to the display panel, the first flexible film comprising a first base film, an output pad portion, and an input pad portion, wherein the first base film includes a surface and an opposite surface facing each other, wherein the output pad portion is disposed on the surface of the first base film and is coupled to the pixel pad portion, and wherein the input pad portion is disposed on the surface of the first base film and is spaced apart from the output pad portion;
 a circuit substrate electrically connected to the display panel through the input pad portion, the circuit substrate including a first driving pad portion; and
 a first substrate disposed on the opposite surface and overlapping either the input pad portion or the output pad portion.

2. The display device of claim 1, wherein each of the input and output pad portions comprises a plurality of pads arranged in a first direction,
 the first substrate comprises a plurality of first patterns arranged in the first direction, and a plurality of second patterns alternately arranged with the first patterns in the first direction, wherein each first pattern has a first width in a second direction crossing the first direction, and each second pattern has a second width smaller than the first width in the second direction, wherein the first patterns overlap the pads of the pad portion overlapped by the first substrate, and the second patterns are disposed between the pads of the pad portion overlapped by the first substrate.

3. The display device of claim 2, wherein the first substrate comprises at least one of plastic or metallic materials.

4. The display device of claim 3, wherein the first substrate is electrically disconnected from the input and output pad portions by the first base film.

5. The display device of claim 1, further comprising:
an input sensing unit including a plurality of sensors disposed on the pixels, and a touch pad portion electrically connected to the sensors.

6. The display device of claim 5, further comprising a second flexible film electrically connected to the touch pad portion,
wherein the second flexible film comprises a rear surface and a top surface facing each other, a touch output pad portion, and a touch input pad portion, wherein the touch output pad portion is disposed on the rear surface of the second flexible film and is coupled to the touch pad portion of the input sensing unit, wherein the touch input pad portion is disposed on the rear surface of the second flexible film and is spaced apart from the touch output pad portion, and
the circuit substrate further comprises a second driving pad portion spaced apart from the first driving pad portion and electrically connected to the touch input pad portion.

7. The display device of claim 6, further comprising a second substrate disposed on the top surface of the second flexible film,
wherein the second substrate overlaps the touch input pad portion and is electrically disconnected from the second driving pad portion by the second flexible film.

8. The display device of claim 1, further comprising a third substrate, which is disposed to face the first driving pad portion and overlapping the first driving pad portion and electrically disconnected from the first driving pad portion by the first base film.

9. The display device of claim 1, wherein the circuit substrate is flexible.

10. A display device, comprising:
a display substrate including a plurality of pixels that display an image, and a plurality of pixel pads connected to the pixels;
a flexible film comprising a base film including a surface facing the pixel pads and an opposite surface facing the surface, and a plurality of output pads disposed on the surface of the base film and coupled to the pixel pads, respectively; and
a rigid substrate disposed on the opposite surface of the base film and overlapping the output pads.

11. The display device of claim 10, wherein the rigid substrate comprises a plurality of first patterns respectively overlapping the output pads and arranged in an arrangement direction of the output pads, and a plurality of second patterns alternately arranged with and connected to the first patterns and disposed between the output pads, and
a width of each of the second patterns is smaller than a width of each of the first patterns, in a direction crossing the arrangement direction of the output pads.

12. The display device of claim 11, wherein the rigid substrate comprises at least one of plastic or metallic materials.

13. The display device of claim 10, wherein at least a portion where the pixel pads and the output pads are in direct contact with each other is formed of a material different from that of the pixel pads and the output pads.

14. A method of fabricating a display device, comprising:
providing a display panel including a plurality of pixels that displays an image, and a pixel pad portion connected to the pixels;
providing a flexible film including a base film, an output pad portion, and a first substrate, wherein the base film includes a surface and an opposite surface facing each other, wherein the output pad portion is disposed on the surface of the base film and is coupled to the pixel pad portion of the display panel, and wherein the first substrate is disposed on the opposite surface of the base film and overlaps the output pad portion;
performing a first aligning step including aligning an ultrasonic wave device to the first substrate;
performing a first bonding step including bonding the pixel pad portion of the display panel to the output pad portion of the flexible film using the ultrasonic wave device,
wherein the ultrasonic wave device is placed to be in contact with the first substrate.

15. The method of claim 14, wherein the first substrate comprises at least one of plastic or metallic materials.

16. The method of claim 14, wherein the first bonding step further comprises melting at least a portion of each of the pixel pad portion and the output pad portion.

17. The method of claim 14, wherein the flexible film comprises:
an input pad portion disposed on the surface of the base film and spaced apart from the output pad portion; and
a second substrate disposed on the opposite surface of the base film and overlapping the input pad portion.

18. The method of claim 17, further comprising:
providing a circuit board including a driving pad portion overlapping the input pad portion;
performing a second aligning step including aligning the ultrasonic wave device to the second substrate; and
performing a second bonding step including bonding the driving pad portion to the input pad portion using the ultrasonic wave device,
wherein the ultrasonic wave device is placed to be in contact with the second substrate.

19. The method of claim 18, wherein the second bonding step further comprises melting at least a portion of each of the driving pad portion and the input pad portion.

20. The method of claim 14, wherein the output pad portion comprises a plurality of pads arranged to be spaced apart from each other in a first direction,
the ultrasonic wave device comprises a generator configured to cause an initial vibrational motion, an amplifier configured to amplify an amplitude of the vibrational motion, a vibrating part configured to transfer a vibration energy from the amplifier to the plurality of pads of the output pad portion and including a protruding portion, and a pressing part configured to exert pressure on the vibrating part, wherein
the protruding portion is configured to be in contact with the first substrate and to perform a horizontal motion in a second direction crossing the first direction.

\* \* \* \* \*